United States Patent
Lee et al.

(10) Patent No.: US 9,257,467 B2
(45) Date of Patent: Feb. 9, 2016

(54) IMAGE SENSOR MODULES, METHODS OF MANUFACTURING THE SAME, AND IMAGE PROCESSING SYSTEMS INCLUDING THE IMAGE SENSOR MODULES

(75) Inventors: Yun Tae Lee, Seoul (KR); Joon Seo Yim, Seoul (KR); Je Suk Lee, Suwon-si (KR); Jae Yong Park, Suwon-si (KR); Jun-Woo Park, Seoul (KR); Su-Young Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 1103 days.

(21) Appl. No.: 12/955,287

(22) Filed: Nov. 29, 2010

(65) Prior Publication Data

US 2011/0141318 A1    Jun. 16, 2011

(30) Foreign Application Priority Data

Dec. 16, 2009 (KR) .................. 10-2009-0125412
Jan. 4, 2010 (KR) .................. 10-2010-0000266
Jun. 3, 2010 (KR) .................. 10-2010-0052290

(51) Int. Cl.
*H01L 27/146* (2006.01)
*H04N 5/225* (2006.01)
(Continued)

(52) U.S. Cl.
CPC ........ *H01L 27/14618* (2013.01); *H04N 5/2257* (2013.01); *H04N 5/3454* (2013.01); *H04N 9/045* (2013.01); *H01L 2224/16225* (2013.01);
(Continued)

(58) Field of Classification Search
CPC . H04N 5/3454; H04N 5/3456; H04N 3/1562; H04N 5/23229; H04N 5/23232; H04N 5/23235; H04N 5/2355

USPC .......................................... 348/240.2, 222.1
See application file for complete search history.

(56) References Cited

U.S. PATENT DOCUMENTS

| | | | |
|---|---|---|---|
| 6,317,331 B1 * | 11/2001 | Kamath et al. | 361/760 |
| 7,405,764 B2 * | 7/2008 | Gustavsson et al. | 348/374 |
| 7,544,529 B2 * | 6/2009 | Chen | H01L 24/24 |
| | | | 257/E21.499 |

(Continued)

FOREIGN PATENT DOCUMENTS

| | | |
|---|---|---|
| CN | 1856002 A | 11/2006 |
| JP | S6240768 A | 2/1987 |

(Continued)

OTHER PUBLICATIONS

Japanese Office Action for corresponding Japanese Patent Application No. 2010-266518 issued on Jun. 11, 2014.

(Continued)

*Primary Examiner* — Twyler Haskins
*Assistant Examiner* — Fayez Bhuiyan
(74) *Attorney, Agent, or Firm* — Harness, Dickey & Pierce, P.L.C.

(57) ABSTRACT

An image sensor module is provided. The image sensor module includes a printed circuit board (PCB), an image sensor chip disposed on a first plane of the PCB and electrically connected to the PCB, and an image signal processing chip disposed on the first plane of the PCB and electrically connected to the PCB. An aspect ratio of the image signal processing chip is at least two times greater than an aspect ratio of the image sensor chip. A minimum feature size of a metal line implemented in the image sensor chip is at least 1.5 times greater than a minimum feature size of a metal line implemented in the image signal processing chip.

32 Claims, 26 Drawing Sheets

(51) Int. Cl.
*H04N 5/345* (2011.01)
*H04N 9/04* (2006.01)

(52) U.S. Cl.
CPC ........... *H01L2224/48091* (2013.01); *H01L 2224/48227* (2013.01)

(56) References Cited

U.S. PATENT DOCUMENTS

| | | | | |
|---|---|---|---|---|
| 7,675,146 | B2* | 3/2010 | Engl et al. | 257/676 |
| 8,518,742 | B1* | 8/2013 | Liu et al. | 438/107 |
| 8,605,212 | B2* | 12/2013 | Itakura | H01L 27/14634 348/372 |
| 2003/0223008 | A1 | 12/2003 | Kim et al. | |
| 2004/0189862 | A1* | 9/2004 | Gustavsson et al. | 348/376 |
| 2006/0219862 | A1* | 10/2006 | Ho et al. | 250/208.1 |
| 2007/0187807 | A1* | 8/2007 | Lee | H01L 23/3107 257/676 |
| 2008/0048097 | A1* | 2/2008 | Chen et al. | 250/208.1 |
| 2008/0273111 | A1* | 11/2008 | Gustavsson et al. | 348/340 |
| 2009/0042336 | A1* | 2/2009 | Paik et al. | 438/107 |
| 2009/0087993 | A1* | 4/2009 | Maxwell | 438/703 |
| 2009/0160519 | A1* | 6/2009 | Keskin et al. | 327/261 |
| 2009/0225197 | A1* | 9/2009 | Takahashi et al. | 348/240.2 |
| 2011/0108908 | A1* | 5/2011 | Lebby et al. | 257/327 |
| 2013/0221470 | A1* | 8/2013 | Kinsman et al. | 257/434 |

FOREIGN PATENT DOCUMENTS

| | | |
|---|---|---|
| JP | H1084509 A | 3/1998 |
| JP | 2002-314060 A | 10/2002 |
| JP | 2005-328476 A | 11/2005 |
| JP | 2006-311051 | 11/2006 |
| JP | 2007-235893 A | 9/2007 |
| JP | 2008-300698 A | 12/2008 |
| JP | 2009-094632 A | 4/2009 |
| KR | 10-2006-0022575 | 3/2006 |
| WO | WO-2006/019156 A1 | 2/2006 |

OTHER PUBLICATIONS

Chinese Office Action for corresponding Chinese Patent Application No. 201010589026.6 issued on Jun. 30, 2014.

* cited by examiner

IMAGE SENSOR MODULES, METHODS OF MANUFACTURING THE SAME, AND IMAGE PROCESSING SYSTEMS INCLUDING THE IMAGE SENSOR MODULES

CROSS-REFERENCE TO RELATED APPLICATIONS

This application claims priority under 35 U.S.C. §119 to Korean Patent Application Nos. 10-2009-0125412, filed Dec. 16, 2009, 10-2010-0000266, filed Jan. 4, 2010, and 10-2010-0052290, filed Jun. 3, 2010, in the Korean Intellectual Property Office (KIPO), the entire contents of which are incorporated herein by reference.

BACKGROUND

The present invention relates to an image sensor module, and more particularly, to an image sensor module including an image sensor chip and an image signal processing chip which are manufactured using complementary metal-oxide-semiconductor (CMOS) processes having different minimum feature sizes, a method of manufacturing the image sensor module, and an image processing system including the same.

Image sensors may be largely divided into charge-coupled device (CCD) image sensors and CMOS image sensors. CMOS image sensors are manufactured using a CMOS process and convert an optical signal into an electrical signal. CMOS image sensors are simpler to operate than CCD image sensors. In addition, CMOS image sensors can be miniaturized and manufactured at low cost since circuits for processing electrical signals output from pixels are integrated into a single chip using the CMOS process and have an advantage of low power consumption.

Due to such advantages of the CMOS process, methods of integrating all of a pixel array, an analog-to-digital converter (ADC) converting an analog signal output from the pixel array into a digital signal, and an image signal processor (ISP) performing image signal processing of the digital signal output from the ADC into a single chip have recently been used.

However, when a CMOS image sensor and an ISP are implemented on one chip using one substrate, digital noise occurring in the ISP may affect the CMOS image sensor.

SUMMARY

Some embodiments of the present invention provide an image sensor module including an image sensor chip and an image signal processing chip which are manufactured using complementary metal-oxide-semiconductor (CMOS) processes having different minimum feature sizes so that digital noise generated in the image signal processing chip does not affect the image sensor chip and the performance and the degree of integration of the image signal processing chip are increased, a method of manufacturing the image sensor module, and an image processing system including the same.

According to some embodiments of the present invention, there is provided an image sensor module including a printed circuit board (PCB), an image sensor chip disposed on a first plane of the PCB and electrically connected to the PCB, and an image signal processing chip disposed on the first plane of the PCB and electrically connected to the PCB. Here, an aspect ratio of the image signal processing chip may be at least two times greater than an aspect ratio of the image sensor chip and a minimum feature size of a metal line implemented in the image sensor chip may be at least 1.5 times greater than a minimum feature size of a metal line implemented in the image signal processing chip.

The aspect ratio of the image sensor chip may be 1.0 through 2.0 and the aspect ratio of the image signal processing chip may be 3 through 10.

The image sensor module may further include a plurality of bonding wires. Here, at least one among the image sensor chip and the image signal processing chip may be electrically connected to the PCB through the plurality of bonding wires.

As an alternative, the image sensor module may further include a plurality of through-silicon vias (TSVs). Here, at least one among the image sensor chip and the image signal processing chip may be electrically connected to the PCB through the plurality of TSVs.

As another alternative, the image sensor module may further include a plurality of solder bumps. Here, at least one among the image sensor chip and the image signal processing chip may be flip-chip-bonded to the PCB through the plurality of solder bumps.

Alternatively, the image sensor module may further include a plurality of bonding wires configured to electrically connect the image sensor chip to the first plane of the PCB and a plurality of solder bumps configured to flip-chip-bond image signal processing chip to the first plane of the PCB.

The image sensor chip may include a pixel array, a timing generator configured to generate a first horizontal synchronization signal and a first vertical synchronization signal whose respective horizontal and vertical blanking periods have been adjusted according to digital zoom ratio information, and an output circuit configured to output a data signal corresponding to a zoom region among data signals corresponding to signals output from the pixel array according to the first vertical synchronization signal and the first horizontal synchronization signal.

The timing generator may increase the horizontal blanking period and simultaneously decrease the vertical blanking period according to the digital zoom ratio information.

The image sensor chip may further include a zoom block configured to receive the data signal corresponding to the zoom region from the output circuit, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

Alternatively, the image signal processing chip may include a zoom block configured to receive the data signal corresponding to the zoom region from the output circuit of the image sensor chip, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

According to other embodiments of the present invention, there is provided a package including a PCB, an image sensor chip disposed on a first plane of the PCB and electrically connected to the PCB, and an image signal processing chip disposed on the first plane of the PCB and electrically connected to the PCB. Here, an aspect ratio of the image signal processing chip may be at least two times greater than an aspect ratio of the image sensor chip, a minimum feature size of a metal line implemented in the image sensor chip may be at least 1.5 times greater than a minimum feature size of a metal line implemented in the image signal processing chip, and an aspect ratio of the package may be 0.8 through 1.2.

According to further embodiments of the present invention, there is provided a camera including a lens and an image sensor module which includes an image sensor chip and an image signal processing chip which are electrically connected to a PCB. Here, the image sensor chip may convert an optical signal passing through the lens into an electrical signal, the image signal processing chip may process the electrical signal output from the image sensor chip, an aspect ratio of the image signal processing chip may be at least two times greater than an aspect ratio of the image sensor chip, and a minimum feature size of a metal line implemented in the image sensor chip may be at least 1.5 times greater than a minimum feature size of a metal line implemented in the image signal processing chip.

The image sensor chip may include a pixel array, a timing generator configured to generate a first horizontal synchronization signal and a first vertical synchronization signal whose respective horizontal and vertical blanking periods have been adjusted according to digital zoom ratio information, and an output circuit configured to output a data signal corresponding to a zoom region among data signals corresponding to signals output from the pixel array according to the first vertical synchronization signal and the first horizontal synchronization signal.

The image sensor chip may further include a zoom block configured to receive the data signal corresponding to the zoom region from the output circuit, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

Alternatively, the image signal processing chip may include a zoom block configured to receive the data signal corresponding to the zoom region from the output circuit of the image sensor chip, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

The aspect ratio of the image sensor chip may be 1.0 through 2.0 and the aspect ratio of the image signal processing chip may be 3 through 10. The camera may be implemented as a part of a mobile phone, a cellular phone, a smart phone, a web camera, a personal digital assistant, a person computer, an image scanner, a netbook, or a notebook computer.

According to other embodiments of the present invention, there is provided a method of manufacturing an image sensor module. The method includes electrically connecting an image sensor chip, which has a first aspect ratio and converts an optical signal into an electrical signal, to a PCB; and electrically connecting an image signal processing chip, which has a second aspect ratio and processes the electrical signal output from the image sensor chip, to the PCB. Here, the first aspect ratio may be greater than 1.0 and less than 2.0, the second aspect ratio may be greater than 3 and less than 10, and a minimum feature size of a metal line implemented in the image sensor chip may be at least 1.5 times greater than a minimum feature size of a metal line implemented in the image signal processing chip.

According to yet other embodiments of the present invention, there is provided a method of manufacturing a camera. The method includes electrically connecting an image sensor chip, which has a first aspect ratio and converts an optical signal into an electrical signal, to a PCB; electrically connecting an image signal processing chip, which has a second aspect ratio and processes the electrical signal output from the image sensor chip, to the PCB; and fixing a lens module including a lens to the PCB so that the optical signal passing through the lens is input to the image sensor chip. Here, the first aspect ratio may be greater than 1.0 and less than 2.0, the second aspect ratio may be greater than 3 and less than 10, and a minimum feature size of a metal line implemented in the image sensor chip may be at least 1.5 times greater than a minimum feature size of a metal line implemented in the image signal processing chip.

According to still other embodiments of the present invention, there is provided an image sensor module including a PCB, an image sensor chip disposed on a first plane of the PCB and electrically connected to the PCB, and an image signal processing chip configured to be embedded in the PCB and to process signals output from the image sensor chip.

The image sensor module may further include a plurality of bonding wires configured to electrically connect the image sensor chip to the PCB and a plurality of bumps embedded in the PCB and connected to the image signal processing chip. Here, the image signal processing chip may process the signals output from the image sensor chip through the plurality of bonding wires and the plurality of bumps.

Alternatively, the image sensor module may further include a plurality of through-silicon vias (TSVs) configured to electrically connect the image sensor chip to the PCB and a plurality of bumps embedded in the PCB and connected to the image signal processing chip. Here, the image signal processing chip may process the signals output from the image sensor chip through the plurality of TSVs and the plurality of bumps.

An aspect ratio of the image signal processing chip may be at least two times greater than an aspect ratio of the image sensor chip and a minimum feature size of a metal line implemented in the image sensor chip may be at least 1.5 times greater than a minimum feature size of a metal line implemented in the image signal processing chip.

In other embodiments, an image sensor chip includes a pixel array, a timing generator configured to generate a first horizontal synchronization signal and a first vertical synchronization signal whose respective horizontal and vertical blanking periods have been adjusted according to digital zoom ratio information, and an output circuit configured to output a data signal corresponding to a zoom region among data signals corresponding to signals output from the pixel array according to the first vertical synchronization signal and the first horizontal synchronization signal.

The timing generator may increase the horizontal blanking period and simultaneously decrease the vertical blanking period according to the digital zoom ratio information.

The timing generator may include a register configured to store the digital zoom ratio information, an address generator configured to output addresses for selecting pixels corresponding to the zoom region in the pixel array, a synchronization signal generator configured to generate the first horizontal synchronization signal and the first vertical synchronization signal, a main control unit configured to control an operation of the address generator and an operation of the synchronization signal generator according to the digital zoom ratio information stored in the register, and a control unit configured to control the output circuit to output the data signal corresponding to the zoom region according to the digital zoom ratio information stored in the register.

The image sensor chip may further include a zoom block configured to receive the data signal corresponding to the zoom region from the output circuit, interpolate the data signal according to the digital zoom ratio information, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

The zoom block may include an interpolator configured to interpolate the digital signal corresponding to the zoom region according to the digital zoom ratio information and generate the interpolated data signal; and a synchronization signal regenerator configured to receive the first horizontal synchronization signal and the first vertical synchronization signal from the timing generator, adjust the horizontal blanking period of the first horizontal synchronization signal according to the digital zoom ratio information, and generate the first vertical synchronization signal and the second horizontal synchronization signal with the adjusted horizontal blanking period. Here, the interpolator may output the interpolated data signal according to the first vertical synchronization signal and the second horizontal synchronization signal.

In further embodiments, an image processing system includes an image sensor chip which includes a pixel array, a timing generator configured to generate a first horizontal synchronization signal and a first vertical synchronization signal whose respective horizontal and vertical blanking periods have been adjusted according to digital zoom ratio information, and an output circuit configured to output a data signal corresponding to a zoom region among data signals corresponding to signals output from the pixel array according to the first vertical synchronization signal and the first horizontal synchronization signal; and an image signal processing chip which includes a zoom block configured to receive the data signal corresponding to the zoom region from the output circuit, interpolate the data signal according to the digital zoom ratio information, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

In yet other embodiments, a method of operating an image sensor chip includes receiving digital zoom ratio information; and simultaneously adjusting a horizontal blanking period of a horizontal synchronization signal and a vertical blanking period of a vertical synchronization signal according to the digital zoom ratio information and generating a first horizontal synchronization signal and a first vertical synchronization signal.

The method may further include selecting some data signals from among data signals corresponding to signals output from a pixel array according to the digital zoom ratio information and outputting the some data signals according to the first vertical synchronization signal and the first horizontal synchronization signal.

The method may further include interpolating the some data signals according to the digital zoom ratio information; generating a second horizontal synchronization signal by adjusting a horizontal blanking period of the first horizontal synchronization signal according to the digital zoom ratio information; and outputting interpolated data signals according to the first vertical synchronization signal and the second horizontal synchronization signal.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
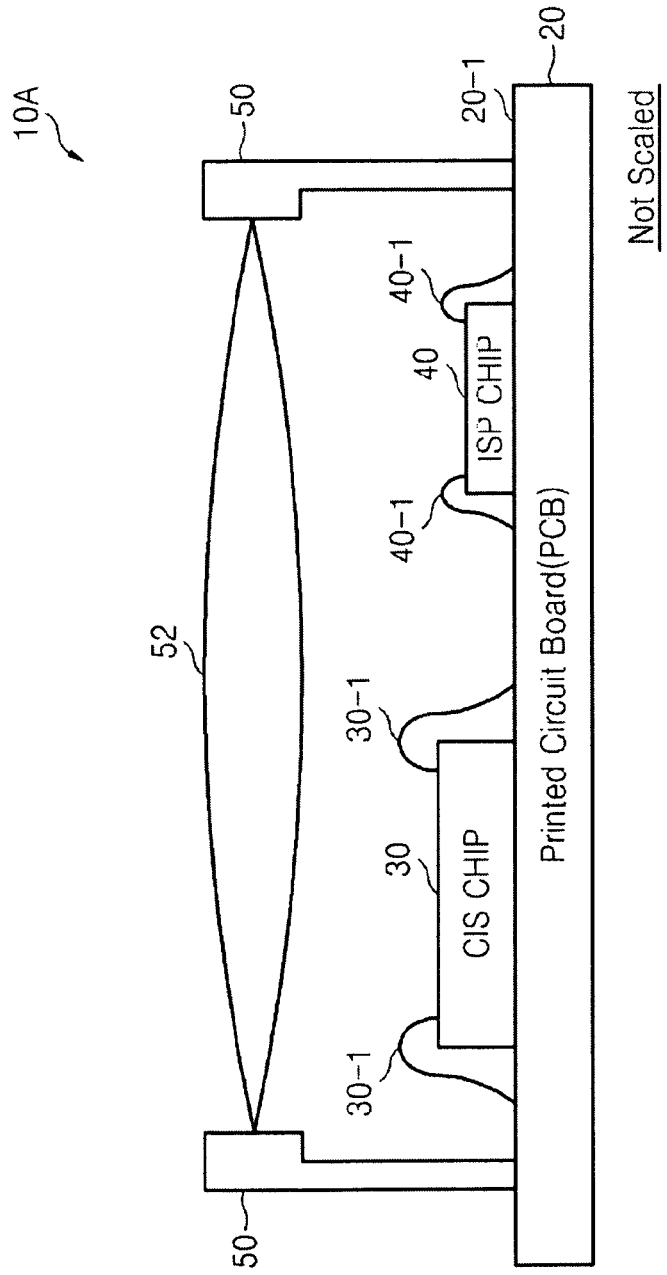
FIG. 1 is a schematic diagram of the structure of an image sensor module according to example embodiments of the present invention.

Example embodiments of the present invention now will be described more fully hereinafter with reference to the accompanying drawings, in which example embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

Accordingly, while example embodiments are capable of various modifications and alternative four's, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific teens) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a schematic diagram of the structure of an image sensor module 10A according to example embodiments of the present invention. The image sensor module or multi-chip module 10A may be used for an image processing system such as a camera and includes a printed circuit board (PCB) 20, an image sensor chip 30, and an image signal processing chip 40. The PCB 20 may be a flexible PCB (FPCB). Since the image sensor chip 30 and the image signal processing chip 40 are separated from each other on a semiconductor substrate, i.e., the PCB 20, influence of digital noise occurring in the image signal processing chip 40 to the image sensor chip 30 is reduced or eliminated.

The image sensor chip 30 is disposed on a first plane 20-1 of the PCB 20 and electrically connected to the PCB 20. The image sensor chip 30 converts an optical signal into an electrical signal. The image sensor chip 30 may include, for example, an opto-electric conversion region including a plurality of optical-to-electrical conversion elements which convert a received optical signal into an electrical signal, a transistor region including a plurality of transistors which transmit the electrical signal output from the opto-electric conversion region to a column line, and a signal processing region including a plurality of processing circuits which process the electrical signal received from the column line and output a processed signal, e.g., a digital signal, to the image signal processing chip 40 as an output signal. The opto-electric conversion region, the transistor region, and the signal processing region may be formed using a fine process, e.g., a 130, 95, 65 nm or less complementary metal-oxide-semiconductor (CMOS) process.

The image signal processing chip 40 is also disposed on the first plane 20-1 of the PCB 20 and electrically connected to the PCB 20. The image signal processing chip 40 may function as an image signal processor (ISP) or digital signal processor (DSP). The image signal processing chip 40 processes an electrical signal output from the image sensor chip 30 and outputs a processed signal to a display device. The processed signal output from the image signal processing chip 40 may be displayed through the display device. The display device may be, for example, a flat panel display device using a thin film transistor liquid crystal display (TFT-LCD), an organic light emitting diode (OLED), an active-matrix OLED (AMOLED), or light-emitting diode (LED). The image signal processing chip 40 may be formed using a 95, 65, 45, 32 nm or less CMOS process.

A minimum feature size of a metal line implemented in the image sensor chip 30 may be 1.5 or more times greater than that of a metal line implemented in the image signal processing chip 40. Since the minimum feature size of the image signal processing chip 40 is less than that of the image sensor chip 30, the degree of integration of the image signal processing chip 40 is higher than that of the image sensor chip 30. As a result, circuits for improving an image signal processing function can be implemented in the image signal processing chip 40, and therefore, the high performance of the image signal processing chip 40 can be achieved. For example, when the image sensor chip 30 is manufactured using a 90 nm CMOS process, the image signal processing chip 40 may be manufactured using a 32 or 42 nm CMOS process. At this time, 90 nm, 45 nm, and 32 nm are minimum feature sizes of a metal line that can be formed using a CMOS process.

The image sensor module 10A also includes a plurality of first bonding wires 30-1 and a plurality of second bonding wires 40-1. The image sensor chip 30 is electrically connected to the PCB 20 through the first bonding wires 30-1 and the image signal processing chip 40 is electrically connected to the PCB 20 through the second bonding wires 40-1.

The image sensor module 10A also includes a lens module mechanically connected to the PCB 20. The lens module includes a lens 52 and a holder 50 supporting the lens 52. The lens module is located at a position allowing an optical signal passing through the lens 52 to be exactly input to a pixel array (not shown) implemented in the image sensor chip 30. The image sensor module 10A and the lens module may be packaged in a single package.

Figure 2:
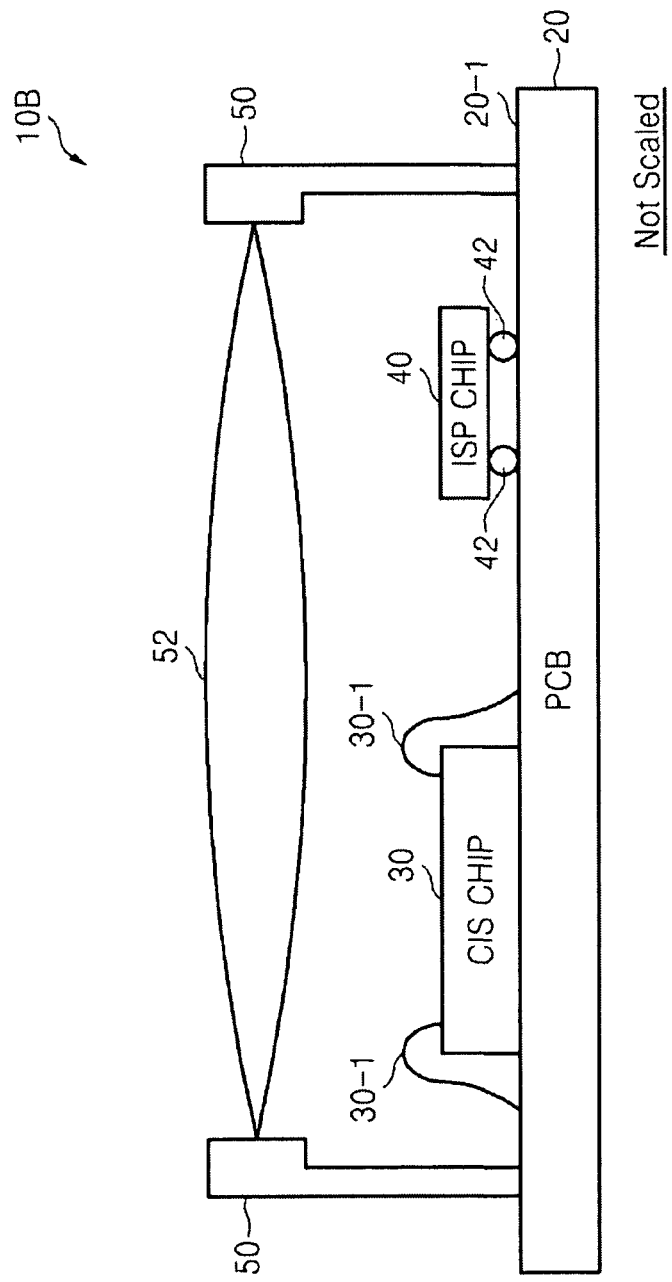
FIG. 2 is a schematic diagram of the structure of an image sensor module according to example embodiments of the present invention.

FIG. 2 is a schematic diagram of the structure of an image sensor module 10B according to other embodiments of the present invention. Referring to FIG. 2, the image sensor module 10B includes the PCB 20, the image sensor chip 30, the image signal processing chip 40, the first bonding wires 30-1, and a plurality of solder bumps 42. The image signal processing chip 40 may be, for example, a flip-chip-bonded through the solder bumps 42 formed on the first plane 20-1 of the PCB 20.

For clarity of the description, it is illustrated in FIG. 2 that the image sensor chip 30 is electrically connected to the PCB 20 through the first bonding wires 30-1 and the image signal processing chip 40 is flip-chip-bonded through the solder bumps 42. According to example embodiments, at least one among the image sensor chip 30 and the image signal processing chip 40 may be flip-chip-bonded through a plurality of solder bumps formed on the first plane 20-1 of the PCB 20.

Figure 3:
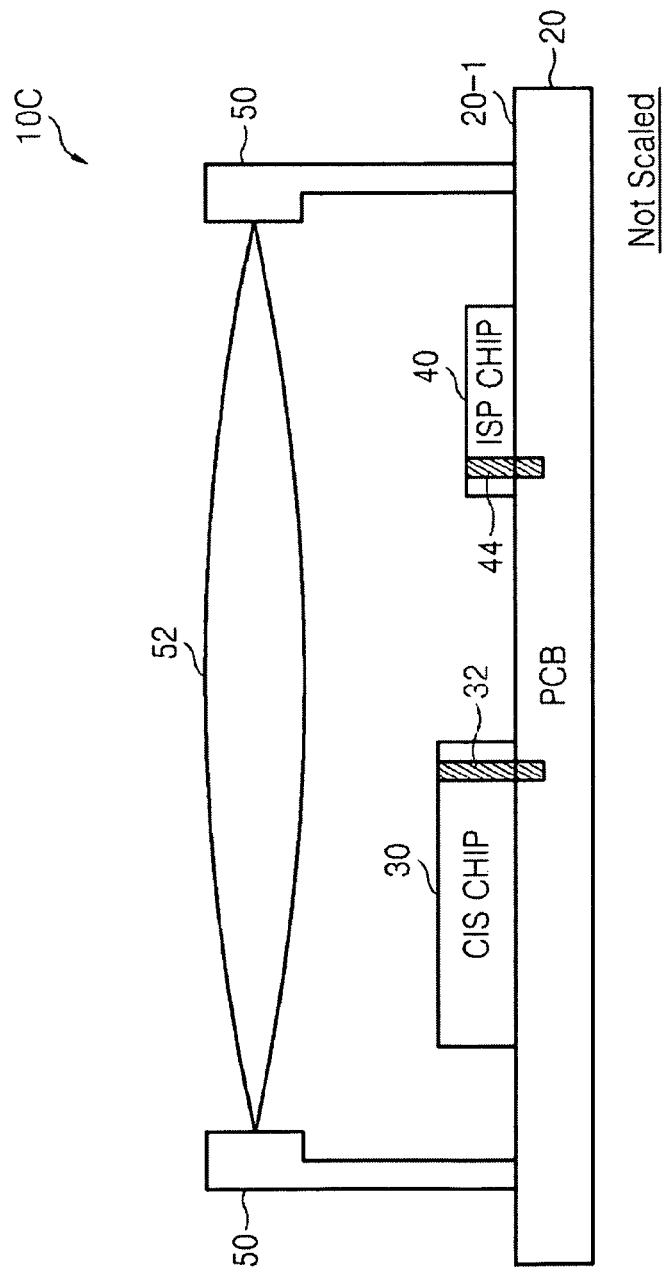
FIG. 3 is a schematic diagram of the structure of an image sensor module according to example embodiments of the present invention.

FIG. 3 is a schematic diagram of the structure of an image sensor module 10C according to example embodiments of the present invention. Referring to FIG. 3, the image sensor module 10C includes the PCB 20, the image sensor chip 30, the image signal processing chip 40, a plurality of first through-silicon vias (TSVs) 32, and a plurality of second TSVs 44.

The image sensor chip 30 is electrically connected to the PCB 20 through the first TSVs 32 and the image signal processing chip 40 is electrically connected to the PCB 20 through the second TSVs 44. Accordingly, the image signal processing chip 40 can process an electrical signal output from the image sensor chip 30 and transmit a processed signal to a display device.

According to example embodiments illustrated in FIGS. 1 through 3, both the image sensor chip 30 and the image signal processing chip 40 may be electrically connected to the PCB 20 through a plurality of bonding wires, bumps or TSVs. According to example embodiments, an image sensor module 10A, 10B, 10C, 10D, 10E, 10F, or 10G illustrated in FIG. 1, 2, 3, 12, 13, 14, or 15 may indicate a module including or excluding the lens module. In addition, an image processing system such as a camera may include the lens module and the image sensor module 10A, 10B, 10C, 10D, 10E, 10F, or 10G.

Figure 4:
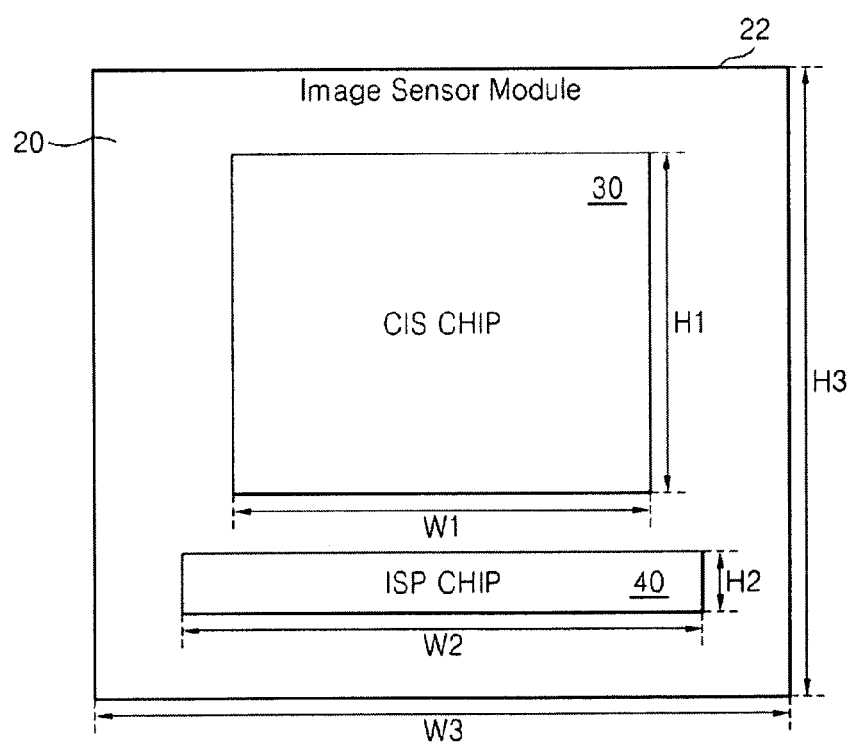
FIG. 4 is a plan view of the image sensor modules illustrated in FIGS. 1, 2, 3, 12, and 13.

FIG. 4 is an example of a plan view of the image sensor modules 10A, 10B, 10C, 10F, and 10G illustrated in FIGS. 1, 2, 3, 14, and 15. Referring to FIG. 4, an image sensor module 22 that may be the image sensor module 10A, 10B, 10C, 10F, or 10G includes image sensor chip 30 and the image signal processing chip 40 which are electrically connected to the PCB 20. The image sensor module 22 may have a square shape.

An aspect ratio, i.e., W1/H1 of the image sensor chip 30 may be 1 through 2. An aspect ratio, i.e., W2/H2 of the image signal processing chip 40 may be 3 through 10. An aspect ratio, i.e., W3/H3 of a package including the image sensor module 22 and the lens module may be 0.8 through 1.2. The package may have an aspect ratio of 0.8 through 1.2 close to a square for an optical system.

Figure 5:
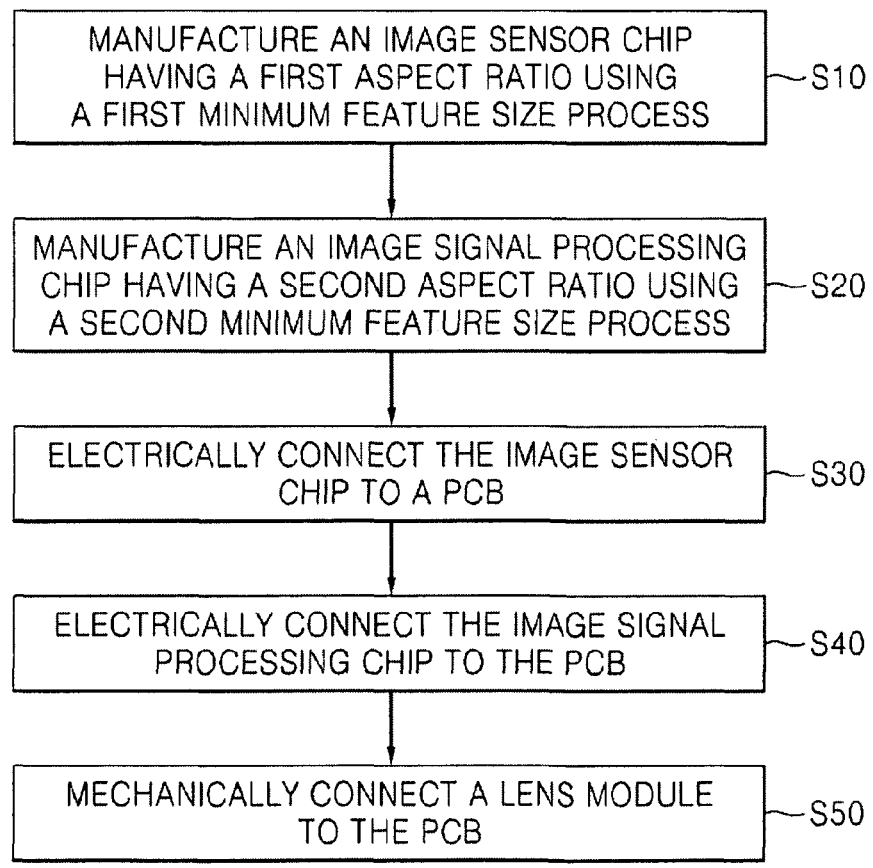
FIG. 5 is a flowchart of a method of manufacturing a camera according to example embodiments of the present invention.

FIG. 5 is a flowchart of a method of manufacturing a camera according to example embodiments of the present invention. The image sensor chip 30 having a first aspect ratio, e.g., 1 through 2, is manufactured using a first minimum feature size CMOS process, e.g., a 90 nm CMOS process, in operation S10. The image signal processing chip 40 having a second aspect ratio, e.g., 3 through 10, is manufactured using a second minimum feature size CMOS process, e.g., a 45 nm or 32 nm CMOS process, in operation S20. Since operations S10 and S20 use different CMOS processes, respectively, the order of operations S10 and S20 may be changed.

In other words, the image sensor chip 30 and the image signal processing chip 40 may be manufactured using CMOS processes having different minimum feature sizes so that a first minimum feature size of a metal line in the image sensor chip 30 is 1.5 or more times greater than a second minimum feature size of a metal line in the image signal processing chip 40.

One chip among the image sensor chip 30 having the first aspect ratio and the image signal processing chip 40 having the second aspect ratio is electrically connected to the first plane 20-1 of the PCB 20 in operation S30. The other chip among the image sensor chip 30 and the image signal processing chip 40 is electrically connected to the first plane 20-1 of the PCB 20 in operation S40. The lens module is mechanically connected to the PCB 20 such that an optical signal passing through the lens 52 is input to the pixel array of the image sensor chip 30 in operation S50.

Figure 6:
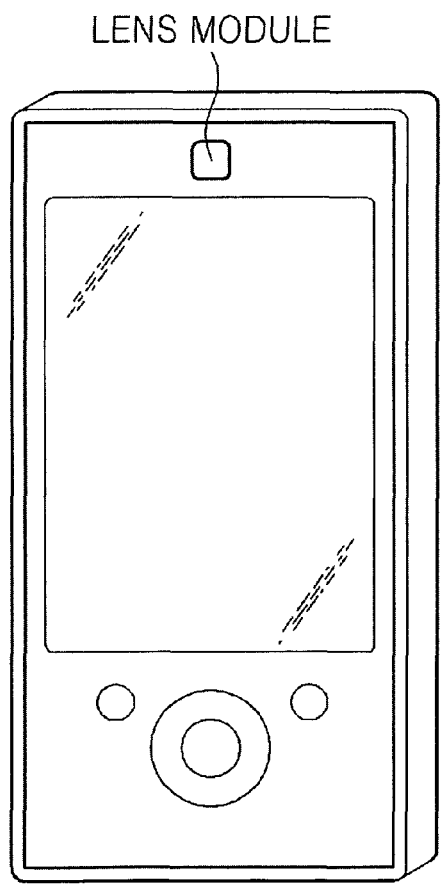
FIG. 6 is a diagram of an image processing system including the image sensor module illustrated in FIG. 1, 2, 3, 12, 13, 14, or 15 according to example embodiments of the present invention.

FIG. 6 is a diagram of an image processing system including the image sensor module 10A, 10B, 10C, 10D, 10E, 10F, or 10G respectively illustrated in FIG. 1, 2, 3, 12, 13, 14, or 15 according to example embodiments of the present invention. The image processing system including the image sensor module 10A, 10B, 10C, 10D, 10E, 10F, or 10G may be implemented as a mobile telephone, a video telephone, a smart phone, or a personal digital assistant (PDA). A lens module is connected to the image sensor chip 30 included in the image sensor module 10A, 10B, 10C, 10D, 10E, 10F, or 10G. The lens module and the image sensor module 10A, 10B, 10C, 10D, 10E, 10F, or 10G may be packaged in a single package.

Figure 7:
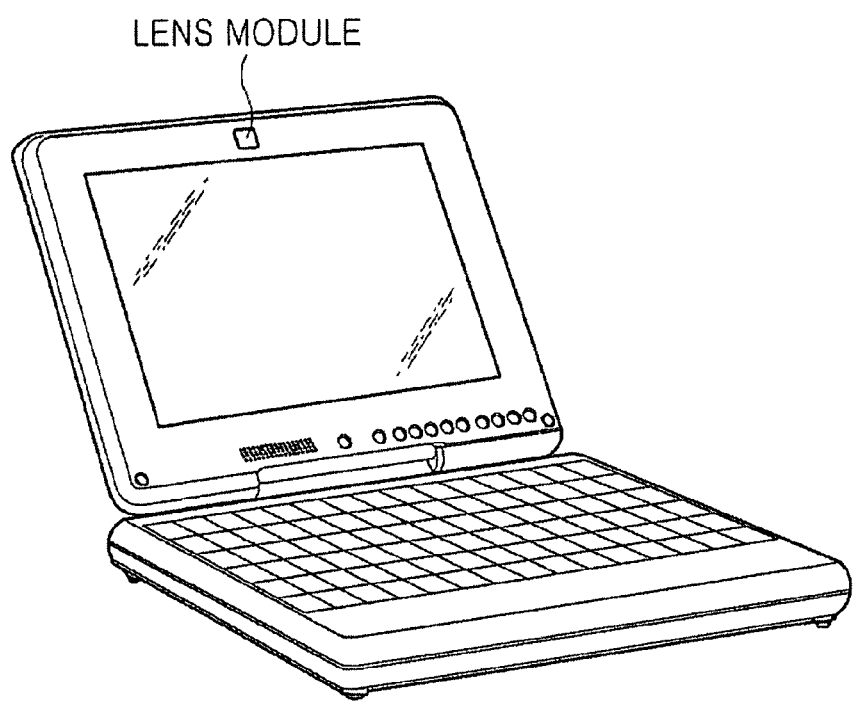
FIG. 7 is a diagram of an image processing system including the image sensor module illustrated in FIG. 1, 2, 3, 12, 13, 14, or 15 according to example embodiments of the present invention.

FIG. 7 is a diagram of an image processing system including the image sensor module 10A, 10B, 10C, 10D, 10E, 10F, or 10G illustrated in FIG. 1, 2, 3, 12, 13, 14, or 15 according to example embodiments of the present invention. The image processing system including the image sensor module 10A, 10B, 10C, 10D, 10E, 10F, or 10G may be used in a personal computer (PC), a tablet PC, a notebook computer, a netbook, a closed-circuit television (CCTV) system, a home automation system, and a satellite system. A lens module is connected to the image sensor chip 30 included in the image sensor module 10A, 10B, 10C, 10D, 10E, 10F, or 10G.

Figure 8:
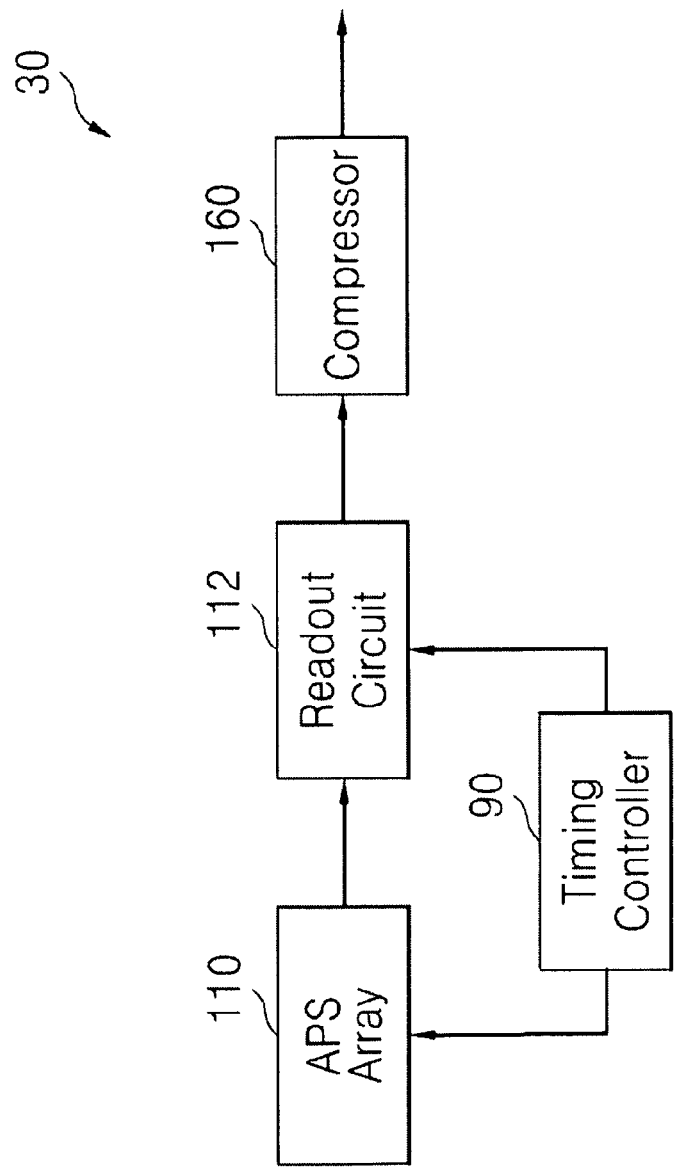
FIG. 8 is a block diagram of an image sensor chip included in the image sensor module illustrated in FIG. 1, 2, 3, 12, 13, 14, or 15 according to example embodiments of the present invention.

FIG. 8 is a block diagram of the image sensor chip 30 included in the image sensor module 10A, 10B, 10C, 10D, 10E, 10F, or 10G illustrated in FIG. 1, 2, 3, 12, 13, 14, or 15 according to example embodiments of the present invention. Referring to FIGS. 1 through 8, the image sensor chip 30 includes a timing controller 90, an active pixel array (or an active pixel sensor array) 110, a readout circuit 112, and a compressor 160. The timing controller 90, the active pixel array 110, the readout circuit 112, and the compressor 160 may include a metal line having a first minimum feature size.

The timing controller 90 generates control signals for controlling the operation of the active pixel array 110 and the operation of the readout circuit 112. The active pixel array 110 includes a plurality of pixels which generate, for example, pixel signals or Bayer signals from optical signals received through the lens 52. The aspect ratio of the active pixel array 110 may be, for example, 4:3 or may be 16:9 for high definition.

The readout circuit 112 converts pixel signals or Bayer signals output from the active pixel array 110 into Bayer digital signals. The Bayer digital signals output from the readout circuit 112 may not have been subjected to any correction process. According to example embodiments, the image sensor chip 30 may not include a circuit block for correcting the pixel signals or Bayer signals output from the active pixel array 110, and therefore, the layout area of the image sensor chip 30 may be remarkably reduced compared to that of conventional image sensors including at least one of correction circuit blocks.

At this time, the "correction process" may include at least one among shading correction, bad pixel correction (BPC), binning, or digital gain adjusting. The shading correction is a process of compensating for reduction of the intensity of light incident on the image sensor chip 30 at the edge of an image due to the characteristics of the lens 52 implemented in the image sensor module 10A, 10B, 10C, 10D, 10E, 10F, or 10G. The BPC is a process of correcting a dead pixel or a bad pixel damaged by heat among pixels included in the active pixel array 110 through comparison between pixels. The binning is a process of eliminating high-frequency components by giving weights to pixels abandoned and pixels selected by sampling and averaging them to improve the picture quality. The digital gain adjusting is a process of adjusting a gain to a level minimizing noise at black level to increase visibility.

The compressor 160 connected to the readout circuit 112 may compress the Bayer digital signals that have not been subjected to any correction and transmits compressed Bayer digital signals to an output interface (not shown). The output interface may be a serial interface or parallel interface.

Alternatively, the readout circuit 112 may output signals that have been subjected to shading correction, BPC, binning, or digital gain adjusting. At this time, the compressor 160 may compress the signals that have been subjected to shading correction, BPC, binning, or digital gain adjusting and transmits compressed signal to the output interface.

Figure 9:
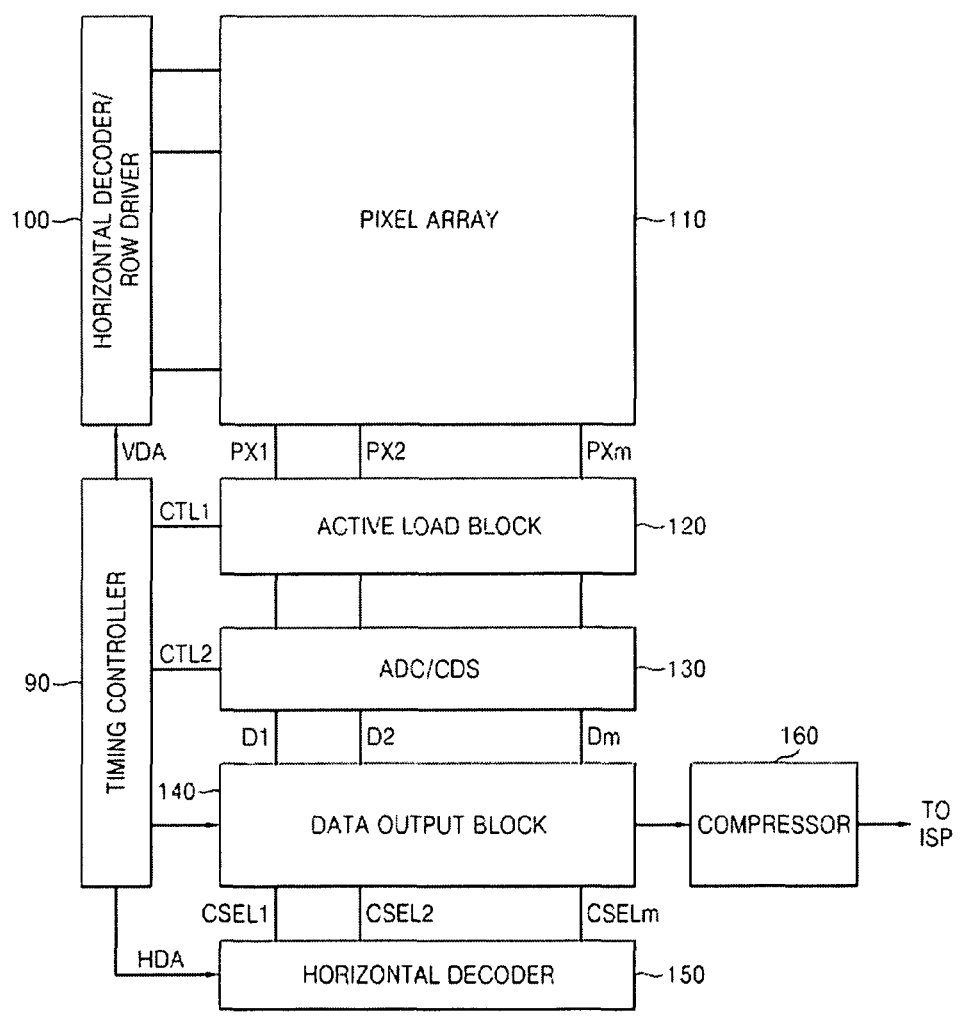
FIG. 9 is a detailed block diagram of the image sensor chip illustrated in FIG. 8.

FIG. 9 is a detailed block diagram of the image sensor chip 30 illustrated in FIG. 8. Referring to FIGS. 8 and 9, the image sensor chip 30 included in the image sensor module 10A, 10B, 10C, 10D, 10E, 10F, or 10G includes the timing controller 90, the pixel array 110, a vertical decoder/row driver 100, an active load block 120, an analog readout circuit 130, a data output block 140, a horizontal decoder 150, and the compressor 160. The minimum feature size of a metal line implemented in each of the elements 90, 100, 110, 120, 130, 140, 150, and 160 is 1.5 or more times greater than that of a metal line implemented in the image signal processing chip 40.

The timing controller 90 generates a plurality of control signals for controlling the overall operation of the image sensor chip 30. The pixel array 110 includes a plurality of pixels that may include a plurality of color pixels, e.g., at least one red pixel, at least one green pixel, and at least one blue pixel. When the image sensor chip 30 is implemented as a three-dimensional image sensor, the plurality of pixels may also include at least one depth (or distance) pixel in addition to the color pixels. The at least one depth pixel may generate photocharges corresponding wavelengths in an infrared range. The pixel array 110 may include a plurality of column lines. A plurality of pixels arranged in a column direction may be connected to each of the column lines.

The active load block 120 includes a plurality of active load circuits each of which may be enabled or disabled in response to a control signal CTL1 output from the timing controller 90. Here, "being enabled" means that a pixel connected to a column line can perform a process for outputting a pixel signal and the pixel signal output from the pixel can be transmitted to the analog readout circuit 130. Conversely, "being disabled" means that a pixel connected to a column line cannot perfomi a process for outputting a pixel signal and no pixel signal is output from the pixel.

The analog readout circuit 130 is a signal processing circuit that processes pixel signals PX1 through PXm respectively output from the column lines. The analog readout circuit 130 may include, for example, a plurality of correlated double sampling (CDS) circuits. The CDS circuits may be respectively connected to the column lines. Each of the CDS circuits may perform CDS on a pixel signal output from a corresponding column line and output a CDS pixel signal. The analog readout circuit 130 may also include a plurality of analog-to-digital converter (ADC) circuits respectively connected to the CDS circuits. Each of the ADC circuits converts a CDS pixel signal into a digital signal.

The data output block 140 transmits output signals D1 through Dm output from the analog readout circuit 130 to the compressor 160. For example, the data output block 140 may output the output signals D1 through Dm of the analog readout circuit 130 to the compressor 160 in response to column selection signals CSEL1 through CSELm, respectively.

The horizontal decoder 150, which may be referred to as a column decoder, decodes a column address HDA output from the timing controller 90 and outputs the column selection signals CSEL1 through CSELm according to a decoding result. The timing controller 90 generates control signals for controlling the operation of the vertical decoder/row driver 100, at least one control signal for controlling the operation of the analog readout circuit 130, control signals for controlling the operation of the data output block 140, and control signals for controlling the operation of the horizontal decoder 150. In some embodiments, the row address VDA and the column address HAD input from an outside, respectively.

The readout circuit 112 may be a circuit including the elements 100, 120, 130, 140, and 150. The compressor 160 compresses pixel signals or Bayer digital signals output from the readout circuit 112, e.g., the data output block 140, and transmits compressed Bayer digital signals to the image signal processing chip 40 through an input/output interface. The pixel signals or Bayer digital signals output from the data output block 140 have not been subjected to any correction process.

Figure 10:
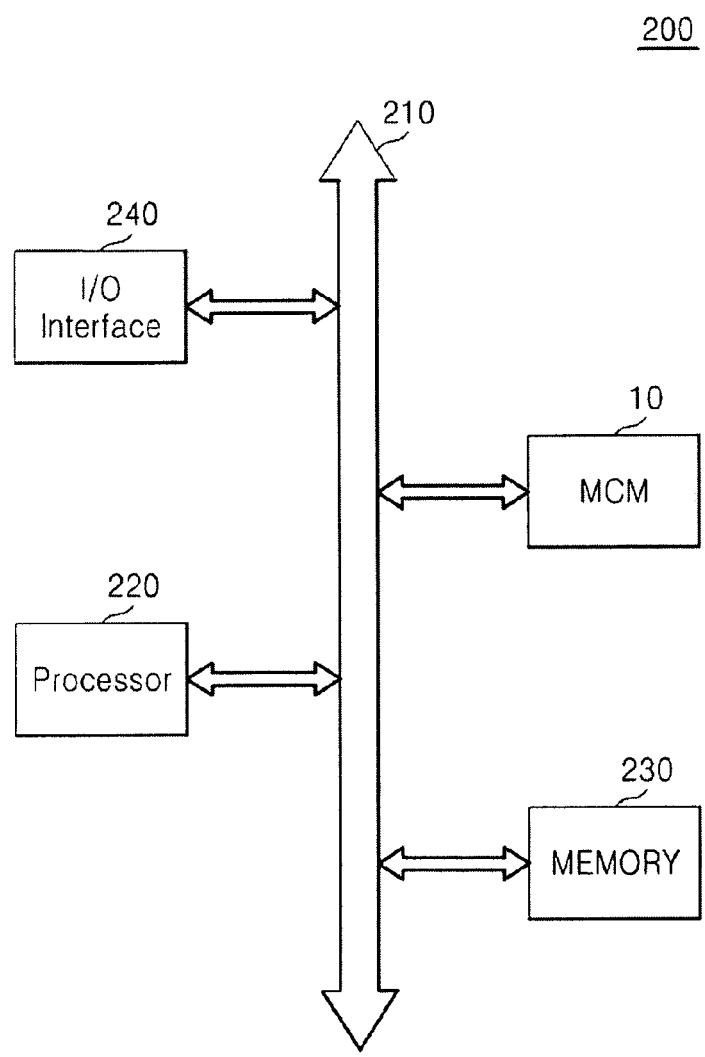
FIG. 10 is a diagram of an image processing system including the image sensor module illustrated in FIG. 1, 2, 3, 12, 13, 14, or 15 according to example embodiments of the present invention.

FIG. 10 is a diagram of an image processing system 200 including the image sensor module 10A, 10B, 10C, 10D, 10E, 10F, or 10G illustrated in FIG. 1, 2, 3, 12, 13, 14, or 15 according to further embodiments of the present invention. The image sensor module (or multi-chip package (MCP)) 10A, 10B, 10C, 10D, 10E, 10F, or 10G is generally denoted by numeral 10 in FIG. 10.

The image processing system 200 includes the image sensor module 10 and a processor 220 controlling the operation of the image sensor module 10. The image processing system 200 may also include a memory device 230 storing data processed by the image sensor module 10. The memory device 230 may be implemented by a non-volatile memory device. The image processing system 200 may also include an input/output (I/O) interface 240.

The processor 220 controls data stored in the memory device 230 to be transmitted to an external device through a system bus 210 and the I/O interface 240. The I/O interface 240 may be a display device or an input device such as a mouse, a keyboard, or a touch pad.

Figure 11:
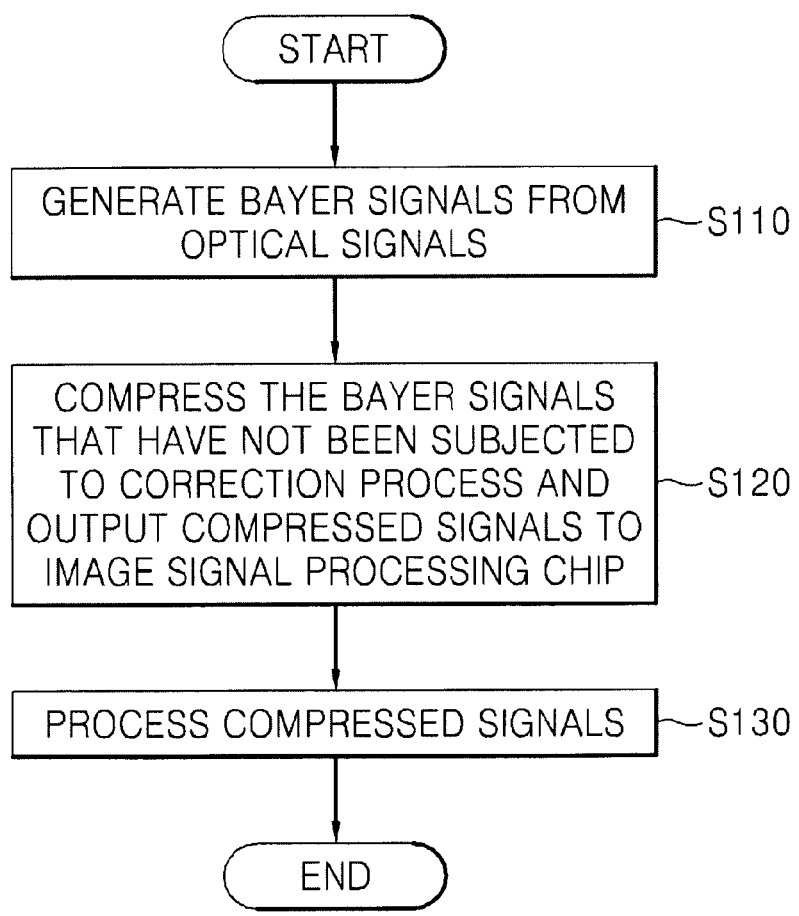
FIG. 11 is a flowchart of the operations of the image processing system illustrated in FIG. 10.

FIG. 11 is a flowchart of the operations of the image processing system 200 illustrated in FIG. 10. Referring to FIGS. 1 through 11, the active pixel array 110 of the image sensor chip 30 generates Bayer signals from optical signals in operation S110. The compressor 160 of the image sensor chip 30 compresses signals output from the read out circuit 112 and outputs compressed signals to the image signal processing chip 40 in operation S120. The signals output from the read out circuit 112 may be Bayer signals that have not been subjected to a correction process. The image signal processing chip 40 performs at least one of processes such as interpolation and color correction on the compressed signals output from the image sensor chip 30 in operation S130. The signals processed by the image signal processing chip 40 may be transmitted to a display device to be displayed.

Figure 12:
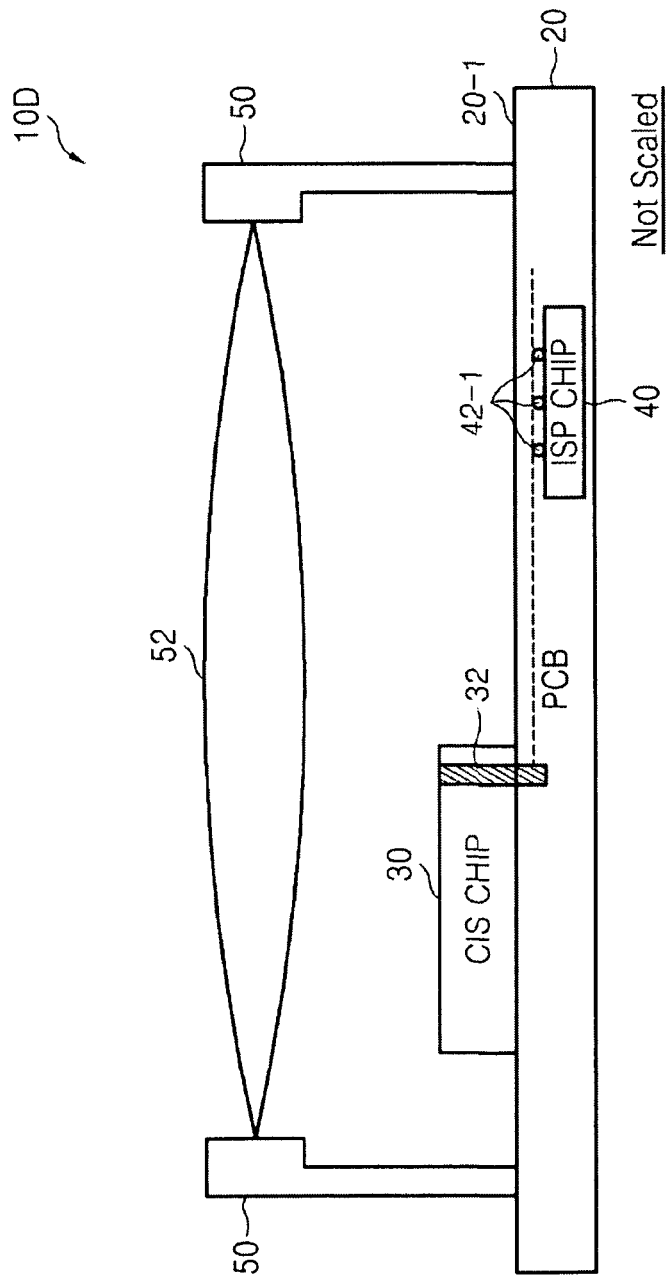
FIG. 12 is a schematic diagram of the structure of an image sensor module according to example embodiments of the present invention.

FIG. 12 is a schematic diagram of the structure of the image sensor module 10D according to other embodiments of the present invention. The image sensor module 10D includes the PCB 20, the image sensor chip 30, the image signal processing chip 40, and a plurality of the TSVs 32.

The image sensor chip 30 is electrically connected to the PCB 20 through the TSVs 32. The image signal processing chip 40 is embedded in the PCB 20. The TSVs 32 may be electrically connected to a plurality of bumps 42-1. Accordingly, signals output from the image sensor chip 30 are transmitted to the image signal processing chip 40 through the TSVs 32 and the bumps 42-1, and therefore, the image signal processing chip 40 may process the signals output from the image sensor chip 30 and transmit processed signals to a display device to be displayed.

In order to prevent heat generated in the image signal processing chip 40 from influencing pixels included in the image sensor chip 30, the aspect ratio of the image signal processing chip 40 is at least two times greater than that of the image sensor chip 30 and the minimum feature size of a metal line included in the image sensor chip 30 is at least 1.5 or more times greater than that of a metal line included in the image signal processing chip 40.

Figure 13:
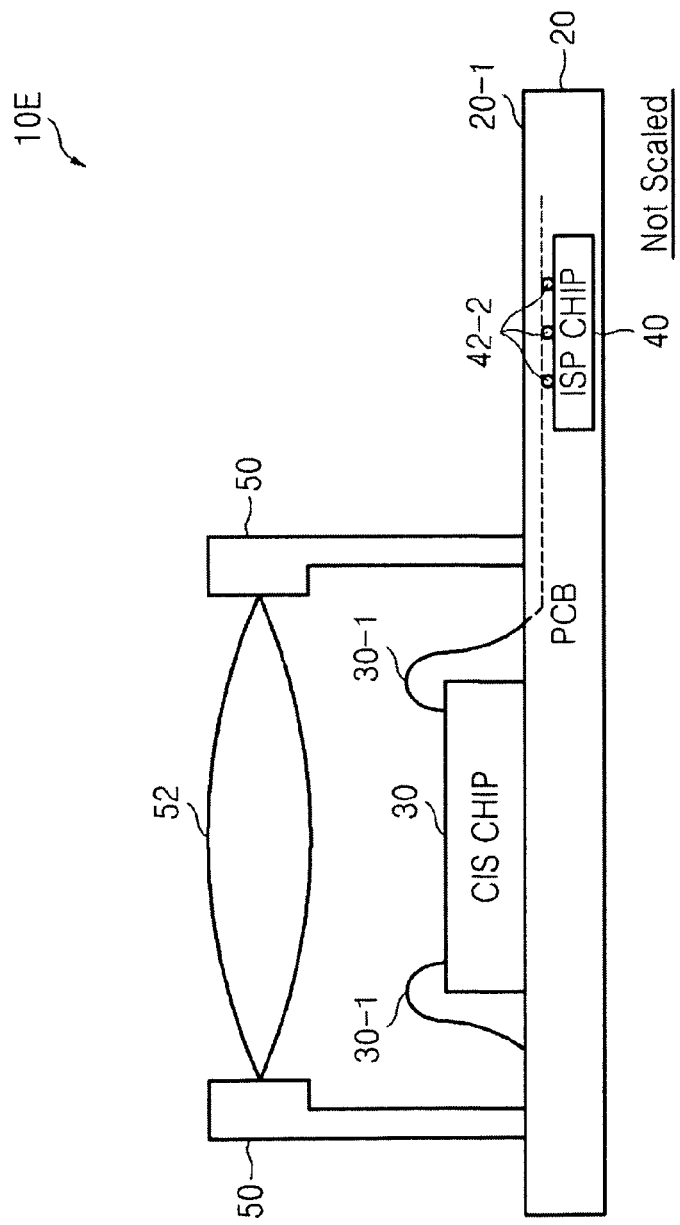
FIG. 13 is a schematic diagram of the structure of an image sensor module according to example embodiments of the present invention.

FIG. 13 is a schematic diagram of the structure of the image sensor module 10E according to yet other embodiments of the present invention. The image sensor module 10E includes the PCB 20, the image sensor chip 30, the image signal processing chip 40, and a plurality of the bonding wires 30-1.

The image sensor chip 30 is electrically connected to the PCB 20 through the bonding wires 30-1 and the image signal processing chip 40 is embedded in the PCB 20. Signals output from the image sensor chip 30 are transmitted to the image signal processing chip 40 through the bonding wires 30-1 and a plurality of bumps 42-2, and therefore, the image signal processing chip 40 may process the signals output from the image sensor chip 30 and transmit processed signals to a display device to be displayed.

In order to prevent heat generated in the image signal processing chip 40 from influencing pixels included in the image sensor chip 30, the aspect ratio of the image signal processing chip 40 is at least two times greater than that of the image sensor chip 30 and the minimum feature size of a metal line included in the image sensor chip 30 is at least 1.5 or more times greater than that of a metal line included in the image signal processing chip 40.

The embodiments illustrated in FIGS. 12 and 13 show examples in which that the image signal processing chip 40 is embedded in the PCB 20 including a plurality of layers. Accordingly, signals output from the image sensor chip 30 may be transmitted to the image signal processing chip 40 through any means for electrical connection. As illustrated in FIG. 12 or 13, the image signal processing chip 40 may be embedded in the PCB 20 to be located below or beside the lens module.

Figure 14:
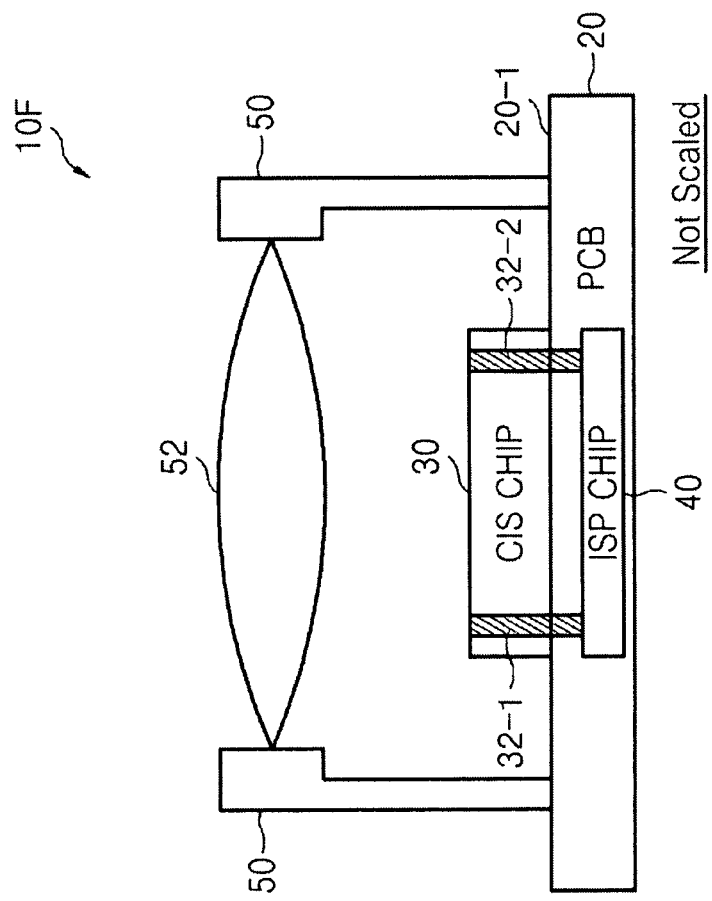
FIG. 14 is a schematic diagram of the structure of an image sensor module according to example embodiments of the present invention.

FIG. 14 is a schematic diagram of the structure of the image sensor module 10F according to example embodiments of the present invention. The image sensor module 10F includes the PCB 20, the image sensor chip 30, the image signal processing chip 40, and a plurality of TSVs 32-1 and 32-2. The image sensor chip 30 is connected to the image signal processing chip 40 embedded in the PCB 20 through the TSVs 32-1 and 32-2. The image sensor chip 30 is formed above the image signal processing chip 40.

Figure 15:
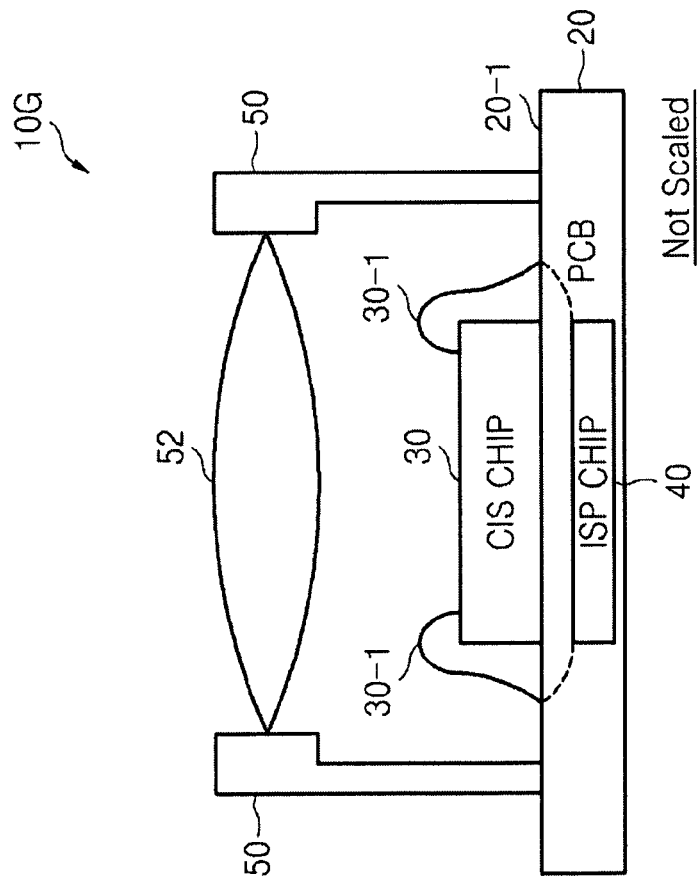
FIG. 15 is a schematic diagram of the structure of an image sensor module according to example embodiments of the present invention.

FIG. 15 is a schematic diagram of the structure of the image sensor module 10G according to further embodiments of the present invention. The image sensor module 10G includes the PCB 20, the image sensor chip 30, the image signal processing chip 40, and a plurality of the bonding wires 30-1. The image sensor chip 30 is connected to the image signal processing chip 40 embedded in the PCB 20 through the bonding wires 30-1. The image sensor chip 30 is formed above the image signal processing chip 40.

Figure 16:
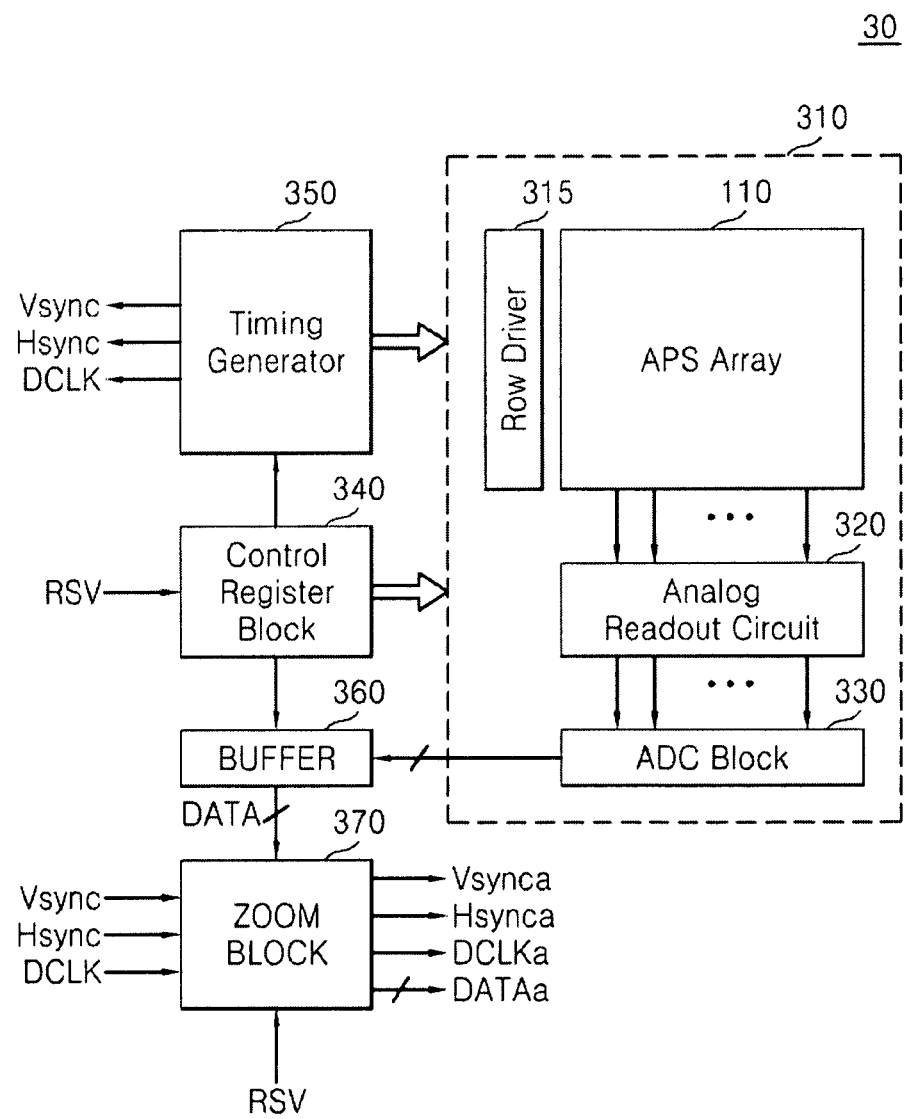
FIG. 16 is a block diagram of the image sensor chip illustrated in FIG. 1, 2, 3, 12, 13, 14, or 15 according to example embodiments of the present invention.

FIG. 16 is a block diagram of the image sensor chip 30 illustrated in FIG. 1, 2, 3, 12, 13, 14, or 15 according to example embodiments of the present invention. Referring to FIG. 16, the image sensor chip 30, which can perform on-the-fly digital zoom, does not need a frame buffer memory for digital zoom. The image sensor chip 30 includes an image signal processing circuit 310, a control register block 340, a timing generator 350, and a buffer 360. A zoom block 370 may be implemented within the image sensor chip 30 as illustrated in FIG. 16 or may be implemented within the image signal processing chip 40 illustrated in FIG. 1, 2, 3, 12, 13, 14, or 15.

The image signal processing circuit 310 outputs data signals corresponding to an optical image. The image signal processing circuit 310 includes the active pixel (sensor) array 110, a row driver 315, an analog readout circuit 320, and an ADC block 330. The active pixel array 110 includes a plurality of pixels as described with reference to FIG. 9 above. Each of the pixels includes a photo sensitive element (for example, photo diode) and a plurality of transistors.

The row driver 315 selects a plurality of pixels in a row from among the plurality of pixels in response to at least one control signal output from the timing generator 350. The analog readout circuit 320 processes pixel signals output from the selected pixels in the row of the active pixel array 110 in response to at least one control signal output from a control register block 340 or the timing generator 350.

The analog readout circuit 320, which has noise elimination function, performs CDS on each of the pixel signals output from the active pixel array 110 and outputs CDS pixel signals. The analog readout circuit 320 may include a plurality of CDS circuits. The CDS circuits may respectively perform CDS on the pixel signals respectively output from a plurality of column included in the active pixel array 110.

The ADC block 330 performs analog-to-digital conversion on pixel signals or CDS pixel signals output from the analog readout circuit 320 and outputs digital signals or data signals to the buffer 360.

The control register block 340 controls the operation of the timing generator 350, the image signal processing circuit 310, or the buffer according to information of data received from an outside, e.g., the image signal processing chip 40. For instance, the control register block 340 may change the settings of a register 351 (FIG. 17) included in the timing generator 350 according to digital zoom ratio information RSV output from the outside, e.g., the image signal processing chip 40. The digital zoom ratio information RSV is information indicating a digital zoom ratio.

The timing generator 350 generates a first horizontal synchronization signal Hsync whose horizontal blanking period has been adjusted, a first vertical synchronization signal Vsync whose vertical blanking period has been adjusted, and a first data clock signal DCLK according to the digital zoom ratio information RSV or information corresponding to the digital zoom ratio information RSV, which is output from the control register block 340. Hereinafter, the digital zoom ratio information RSV includes the digital zoom ratio information RSV and the information corresponding to the digital zoom ratio information RSV, which is received from an outside, e.g., the image signal processing chip 40 or a digital signal processor (DSP).

In other words, the timing generator 350 adjusts the horizontal blanking period of the first horizontal synchronization signal Hsync according to the digital zoom ratio information RSV and simultaneously adjusts the vertical blanking period of the first vertical synchronization signal Vsync to maintain a frame rate constant regardless of the digital zoom ratio. Accordingly, the timing generator 350 outputs the first vertical synchronization signal Vsync with the adjusted vertical blanking period, the first horizontal synchronization signal Hsync with the adjusted horizontal blanking period, and the first data clock signal DCLK.

The buffer 360 buffers data signals, e.g., data signals corresponding to a zoom region, output from the ADC block 330 of the image signal processing circuit 310 and outputs buffered data signals to the zoom block 370 in compliance with the control register block 340. An output circuit may indicate a circuit including the row driver 315, the analog readout circuit 320, and the ADC block 330 or a circuit including the row driver 315, the analog readout circuit 320, the ADC block 330, and the buffer 360.

The zoom block 370, which performs on-the-fly digital zoom, interpolates data signals corresponding to the zoom region (e.g., a portion of data signals for digital zoom or a selected region on a display for digital zoom), which are output from the output circuit, i.e., data signals selected according to the zoom ratio from among all data signals for an entire region according to the digital zoom ratio information RSV. The zoom block 370 receives the first horizontal synchronization signal Hsync, the first vertical synchronization signal Vsync, and the first data clock signal DCLK from the timing generator 350; readjusts the horizontal blanking period of the first horizontal synchronization signal Hsync according to the digital zoom ratio information RSV; and outputs an interpolated data signal DATAa according to a second vertical synchronization signal Vsynca, a second horizontal synchronization signal Hsynca with the readjusted horizontal blanking period, and a second data clock signal DCLKa. At this time, the second vertical synchronization signal Vsynca is the same as the first vertical synchronization signal Vsync and the second data clock signal DCLK is the same as the first data clock signal DCLK. Alternatively, the zoom block 370 may bypass the first vertical synchronization signal Vsync and the first data clock signal DCLK.

Figure 17:
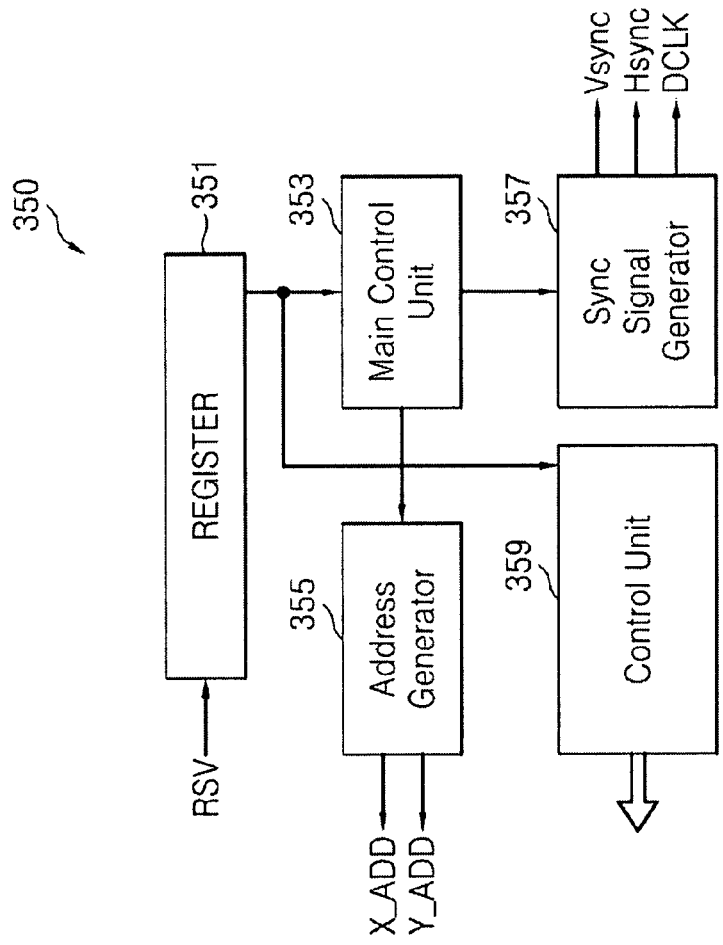
FIG. 17 is a block diagram of a timing generator included in the image sensor chip illustrated in FIG. 16.

FIG. 17 is a block diagram of the timing generator 350 included in the image sensor chip 30 illustrated in FIG. 16. Referring to FIGS. 16 and 17, the timing generator 350 includes the register 351, a main control unit 353, an address generator 355, a synchronization signal generator 357, and a control unit 359.

The register 351 receives the digital zoom ratio information RSV from the control register block 340 and stores it. For example, the digital zoom ratio information RSV may include one or more bits. The main control unit 353 controls the operation of the address generator 355 and the operation of the synchronization signal generator 357 according to the digital zoom ratio information RSV stored in the register 351.

The address generator 355 outputs addresses X-ADD and Y-ADD for selecting a plurality of pixels corresponding to a zoom region from among all pixels included in the active pixel array 110 in compliance with the main control unit 353. Accordingly, the image signal processing circuit 310 can select only pixels corresponding to the zoom region according to the row addresses X-ADD and the column addresses Y-ADD.

The synchronization signal generator 357 simultaneously adjusts the vertical blanking period of a vertical synchronization signal and the horizontal blanking period of a horizontal synchronization signal in compliance with the main control unit 353 and generates the first vertical synchronization signal Vsync with an adjusted vertical blanking period and the first horizontal synchronization signal Hsync with an adjusted horizontal blanking period. The synchronization signal generator 357 may also generate the first data clock signal DCLK in compliance with the main control unit 353. Here, the first vertical synchronization signal Vsync defines the beginning and the end of a frame (or data of a single frame), the first horizontal synchronization signal Hsync defines the beginning and the end of a line (or data of a single line), and the first data clock signal DCLK is used to transmit pixel data.

The control unit 359 controls the output circuit to output data signals corresponding to the zoom region in the active pixel array 110 according to the digital zoom ratio information RSV stored in the register 351. The control unit 359 may control the zoom region to be selected according to the addresses X-ADD and Y-ADD generated by the address generator 355 and the digital zoom ratio information RSV and control data signals output from the plurality of pixels included in the selected zoom region to be transmitted to the buffer 360 or the zoom block 370.

Figure 18:
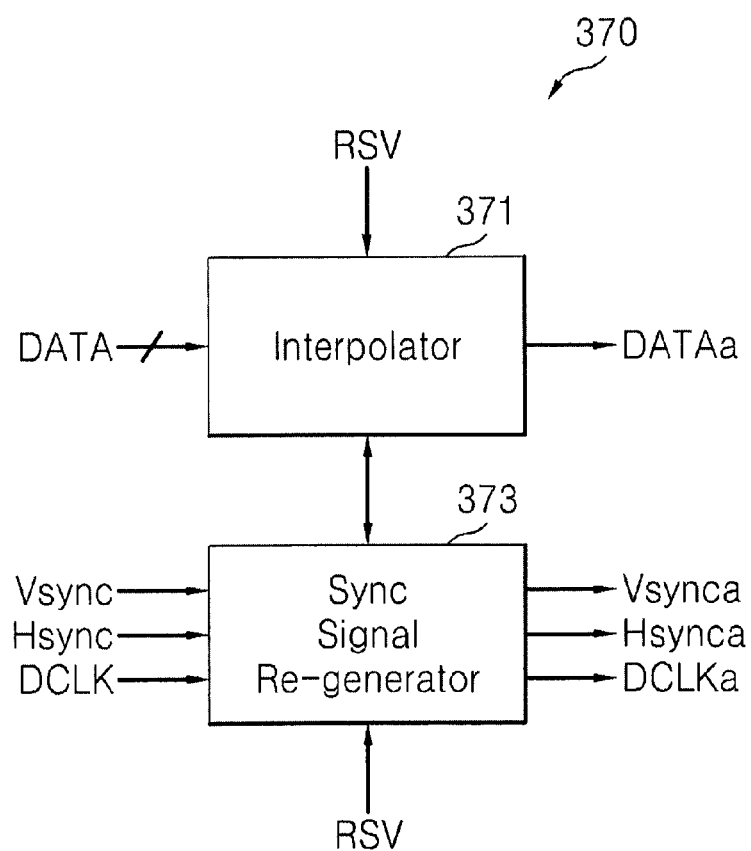
FIG. 18 is a block diagram of a zoom block illustrated in FIG. 16.

FIG. 18 is a block diagram of the zoom block 370 illustrated in FIG. 16. Referring to FIGS. 16 through 18, the zoom block 370, which may be implemented in either the image sensor chip 30 or the image signal processing chip 40, includes an interpolator 371 and a synchronization signal regenerator 373. The interpolator 371 interpolates data signals DATA corresponding to a zoom region, which have been buffered by the buffer 360, according to the digital zoom ratio information RSV and generates an interpolated data signal DATAa.

The synchronization signal regenerator 373 receives the first vertical synchronization signal Vsync, the first horizontal synchronization signal Hsync, and the first data clock signal DCLK from the timing generator 350, adjusts the horizontal blanking period of the first horizontal synchronization signal Hsync according to the digital zoom ratio information RSV, and generates the second horizontal synchronization signal Hsynca with the readjusted horizontal blanking period. The synchronization signal regenerator 373 also generates the second vertical synchronization signal Vsynca substantially the same as the first vertical synchronization signal Vsync and the second data clock signal DCLKa substantially the same as the first data clock signal DCLK. The interpolator 371 may output the interpolated data signal DATAa according to the second vertical synchronization signal Vsynca, the second horizontal synchronization signal Hsynca, and the second data clock signal DCLKa.

Figure 19:
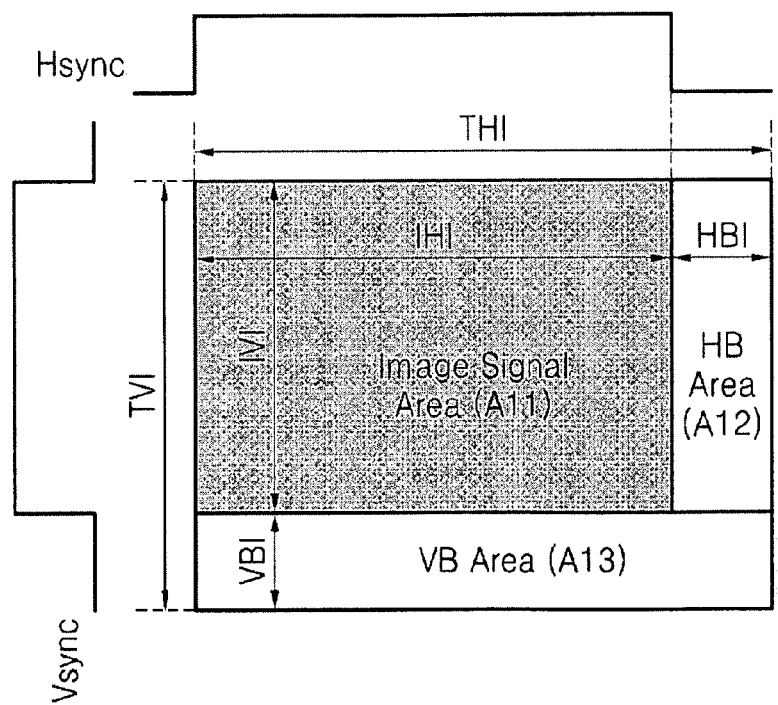
FIG. 19 is a diagram showing a frame before the length of a horizontal blanking period and the length of a vertical blanking period are adjusted by the timing generator illustrated in FIG. 16.

FIG. 19 is a diagram showing a frame before the length of a horizontal blanking period and the length of a vertical blanking period are adjusted by the timing generator 350 illustrated in FIG. 16. Referring to FIG. 9, a single frame (or a diagram of data signals output from the image sensor chip 30) includes an image signal area (or an active area) A11, a horizontal blanking (HB) area (or a non-active area) A12, and a vertical blanking (VB) area (or a non-active area) A13. While the first vertical synchronization signal Vsync and the first horizontal synchronization signal Hsync are maintained at a first level, e.g., a high level, (or a second level, e.g., a low level), an image corresponding to data signals is displayed only in the image signal area A11.

Figure 20:
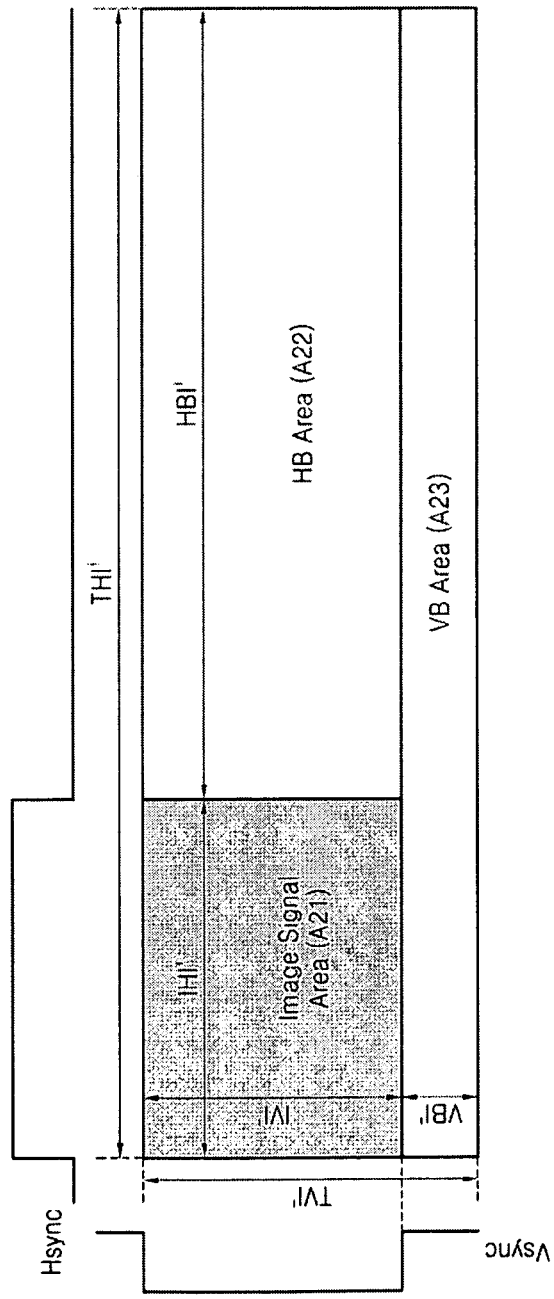
FIG. 20 is a diagram showing a frame after the length of a horizontal blanking period and the length of a vertical blanking period are adjusted by the timing generator illustrated in FIG. 16.

FIG. 20 is a diagram showing a frame after the length of a horizontal blanking period and the length of a vertical blanking period are adjusted by the timing generator 350 illustrated in FIG. 16. Referring to FIGS. 19 and 20, when a digital zoom ratio is greater than 1, the horizontal blanking period of the first horizontal synchronization signal Hsync increases from HBI to HBI' (i.e., HBI'>HBI) and the vertical blanking period of the first vertical synchronization signal Vsync decreases from VBI to VBI' (i.e., VBI'<VBI).

When the digital zoom ratio increases, the horizontal blanking period of the first horizontal synchronization signal Hsync increases from HBI to HBI' and the vertical blanking period of the first vertical synchronization signal Vsync decreases from VBI to VBI'. Accordingly, the horizontal length of an image decreases from IHI to IHI' and the vertical length of the image decreases from IVI to IVI'.

Accordingly, even when a total horizontal length increases from THI to THI' since the horizontal blanking period of the first horizontal synchronization signal Hsync increases from HBI to HBI', a VB area A23 is the same as the VB area A13 since the vertical blanking period of the first vertical synchronization signal Vsync decreases from VBI to VBI'. As a result, a frame rate is maintained constant regardless of the digital zoom ratio. In other words, the zoom block 370 adjusts the vertical blanking period of the first vertical synchronization signal Vsync in real time or on-the-fly to maintain the frame rate constant regardless of the digital zoom ratio.

Figure 21:
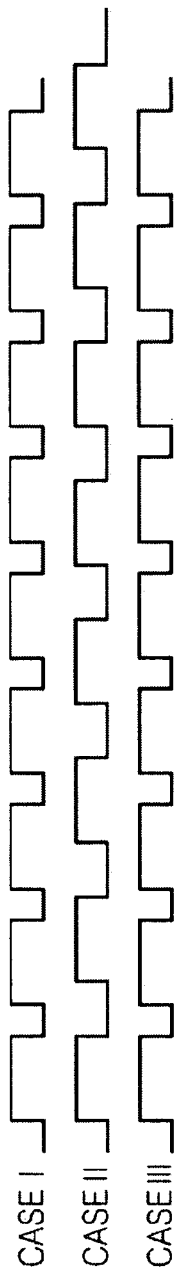
FIG. 21 is a timing chart for explaining a method of adjusting the vertical blanking period using the timing generator illustrated in FIG. 16.

FIG. 21 is a timing chart for explaining a method of adjusting a vertical blanking period using the timing generator 350 illustrated in FIG. 16. Referring to FIG. 21, CASE I denotes a waveform of the first vertical synchronization signal Vsync when a digital zoom ratio is 1; and CASE II denotes a waveform of the first vertical synchronization signal Vsync when the horizontal blanking period of the first horizontal synchronization signal Hsync is increased but the vertical blanking period of the first vertical synchronization signal Vsync is not decreased at a digital zoom ratio of 2.

Referring to FIGS. 19 through 21, when the vertical blanking period of the first vertical synchronization signal Vsync is not decreased as the horizontal blanking period of the first horizontal synchronization signal Hsync is increased from HBI to HBI', the total horizontal length THI' is increased, and therefore, the VB area A23 is increased, which causes the frame rate to be decreased. To prevent the decrease of the frame rate, the timing generator 350 increases the horizontal blanking period of the first horizontal synchronization signal Hsync to HBI' and decreases the vertical blanking period of the first vertical synchronization signal Vsync to VBI' at the same time, as illustrated in FIGS. 16, 20, and 21 (CASE III). Consequently, the timing generator 350 generates the constant first vertical synchronization signal Vsync regardless of the digital zoom ratio.

Figure 22:
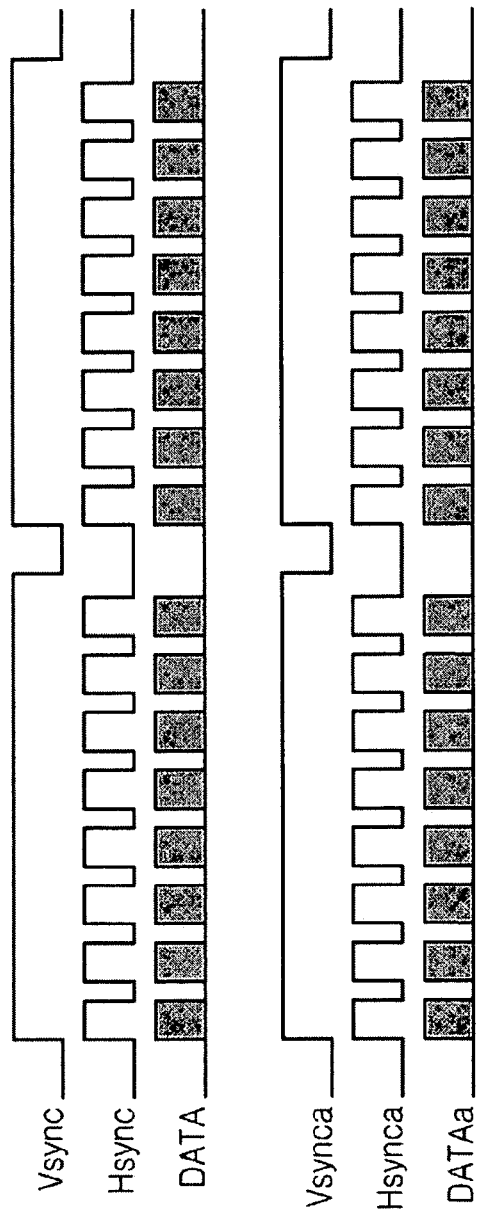
FIG. 22 is a diagram showing waveforms of input signals and output signals of the zoom block illustrated in FIG. 16 according to some embodiments of the present invention.
Figure 23:
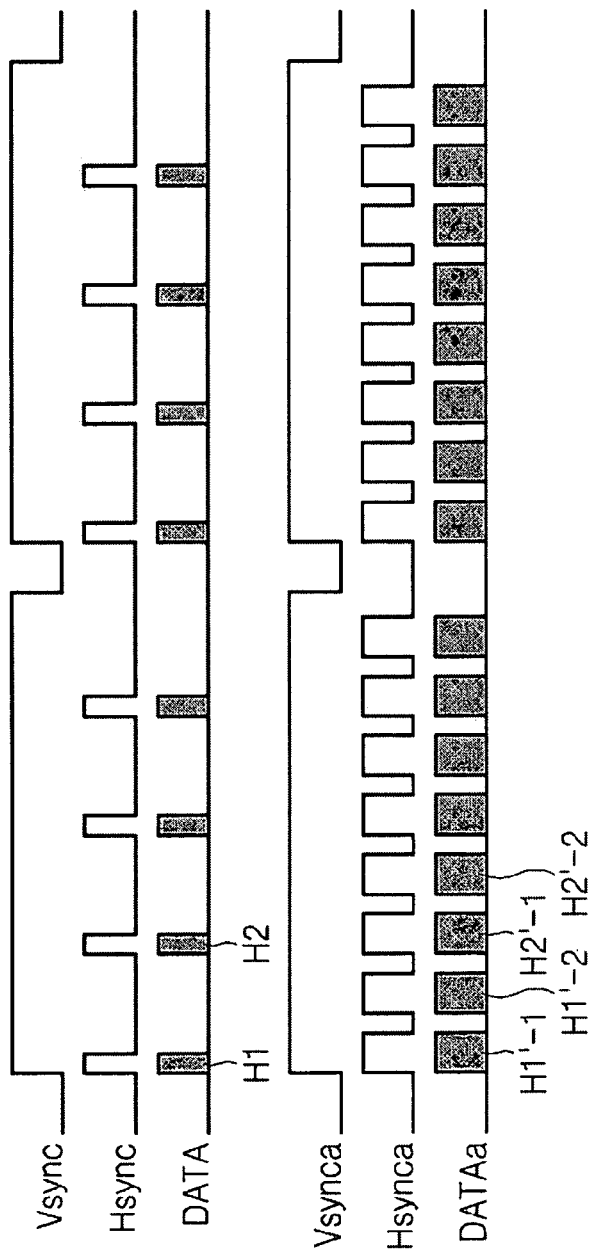
FIG. 23 is a diagram showing waveforms of input signals and output signals of the zoom block illustrated in FIG. 16 according to example embodiments of the present invention.

FIG. 22 is a diagram showing waveforms of input signals and output signals of the zoom block 370 illustrated in FIG. 16 according to some embodiments of the present invention. In detail, FIG. 22 shows the waveforms of the input signals Vsync, Hsync, and DATA and the output signals Vsynca, Hsynca, and DATAa of the zoom block 370 when the digital zoom ratio is 1. FIG. 23 is a diagram showing waveforms of input signals and output signals of the zoom block 370 illustrated in FIG. 16 according to other embodiments of the present invention. In detail, FIG. 23 shows the waveforms of the input signals Vsync, Hsync, and DATA and the output signals Vsynca, Hsynca, and DATAa of the zoom block 370 when the digital zoom ratio is 2.

Referring to FIGS. 16, 20, 22, and 23, when the digital zoom ratio is 2, the timing generator 350 increases the horizontal blanking period of the first horizontal synchronization signal Hsync and simultaneously decreases the vertical blanking period of the first vertical synchronization signal Vsync to maintain the frame rate constant according to the digital zoom ratio information RSV indicating that the digital zoom ratio is 2 and outputs the first vertical synchronization signal Vsync with the decreased vertical blanking period VBI' and the first horizontal synchronization signal Hsync with the increased horizontal blanking period HBI'.

The image signal processing circuit 310 outputs only the data signal DATA corresponding to the zoom region in the active pixel array 110 according to the first vertical synchronization signal Vsync and the first horizontal synchronization signal Hsync in response to the digital zoom ratio information RSV.

Figure 24:
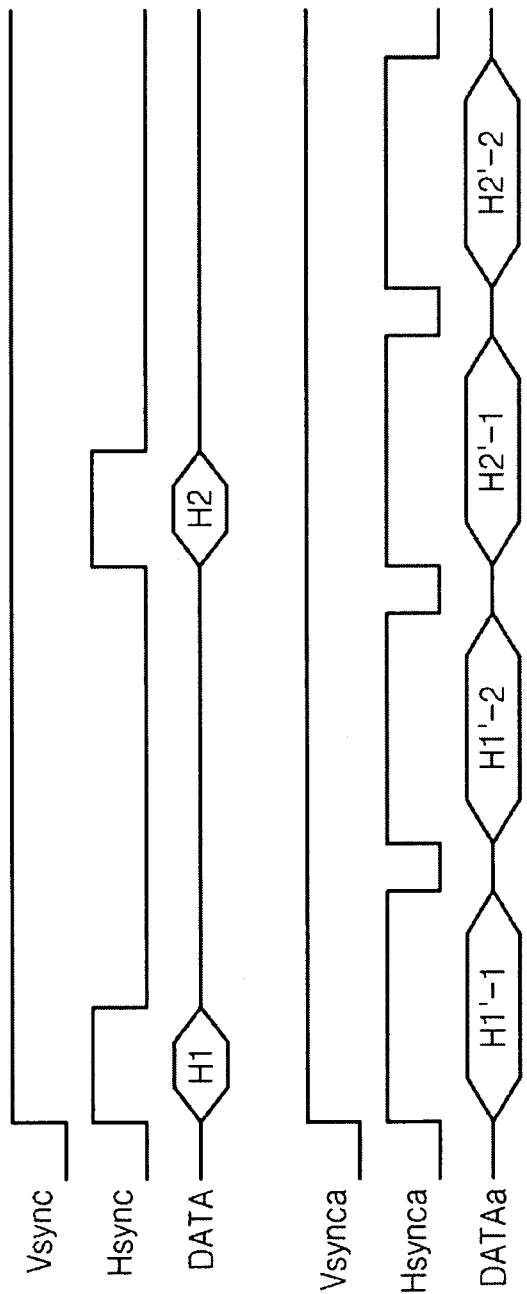
FIG. 24 is a partially enlarged diagram of the waveforms illustrated in FIG. 23.

FIG. 24 is a partially enlarged diagram of the waveforms illustrated in FIG. 23. Referring to FIGS. 16, 22, 23, and 24, the zoom block 370 interpolates the data signal DATA according to the digital zoom ratio information RSV indicating the digital zoom ratio is 2 and generates the interpolated data signal DATAa. The zoom block 370 also adjusts, e.g., decreases, the horizontal blanking period of the first horizontal synchronization signal Hsync according to the digital zoom ratio information RSV and generates the second horizontal synchronization signal Hsynca with the readjusted horizontal blanking period.

As illustrated in FIG. 24, the zoom block 370 interpolates a first data signal H1, generates interpolated first data signals H1'-1 and H1'-2 and outputs the interpolated first data signals H1'-1 and H1'-2 according to the second horizontal synchronization signal Hsynca. The zoom block 370 also interpolates a second data signal H2, generates interpolated second data signals H2'-1 and H2'-2, and outputs the interpolated second data signals H2'-1 and H2'-2 according to the second horizontal synchronization signal Hsynca. As illustrated in FIGS. 22 and 23, when the digital zoom ratio increases, the number of toggles in the second horizontal synchronization signal Hsynca according to which interpolated data signals are output also increases.

Figure 25:
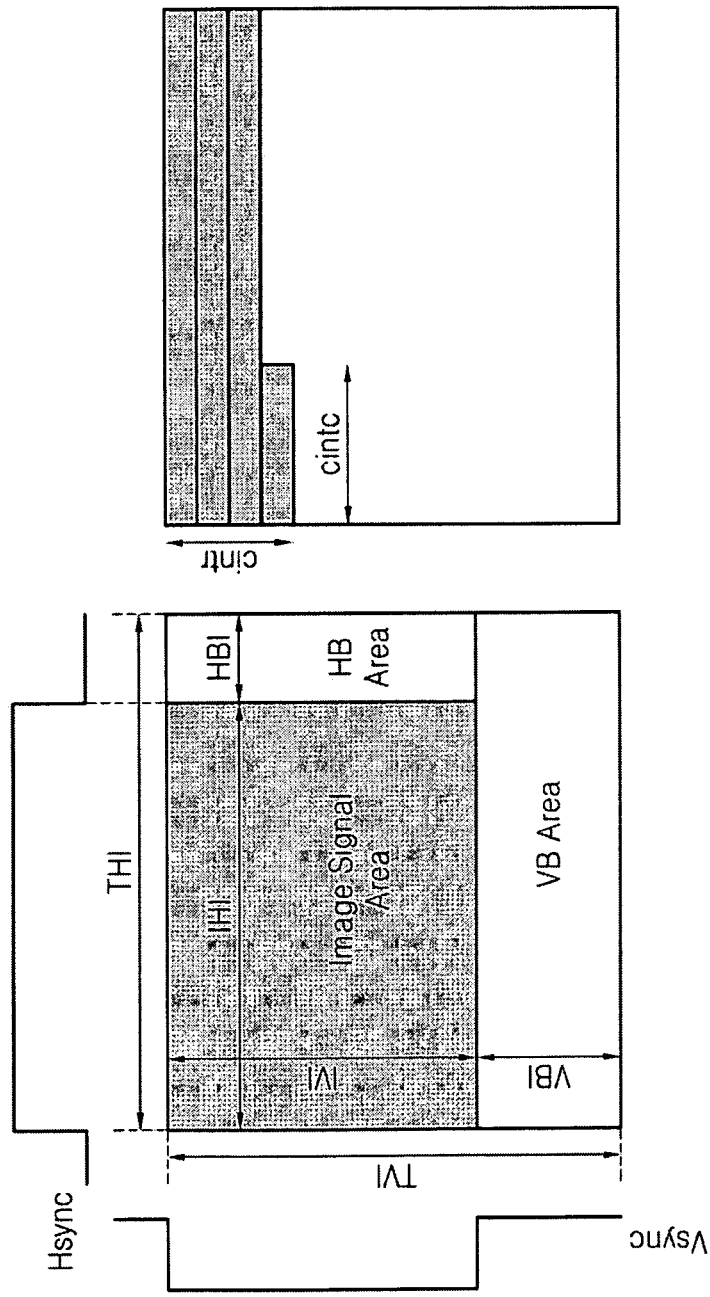
FIG. 25 is a diagram for explaining exposure time.

FIG. 25 is a diagram for explaining exposure time. When an image output from the image sensor chip 30 is illustrated as shown in FIG. 25, a horizontal image length IHI and a horizontal blanking period HBI may be expressed in pixel units and a vertical image length IVI and a vertical blanking period VBI may be expressed in line units.

The brightness of an image displayed on a display device is defined by two values cintr and cintc which set an exposure time of each of pixels included in the display device. Here, "cintr" denotes the number of lines and "cintc" denotes the number of pixels. Accordingly, the exposure time is defined by (cintr*THI)+cintc.

Referring to FIGS. 19, 20, and 25, when the horizontal blanking period HBI of the first horizontal synchronization signal Hsync is increased for digital zoom, a total horizontal length THI is also increased. Accordingly, the exposure time is changed. Accordingly, in order to maintain the brightness of an image regardless of a digital zoom ratio, the values cintr and cintc need to be changed so that (cintr*THI)+cintc= (cintr'*THI')+cintc'. Here, "cintr'" and "cintc'" denote the number of lines and the number of pixels, respectively, in an interpolated image and THI' denotes a changed total horizontal length.

Figure 26:
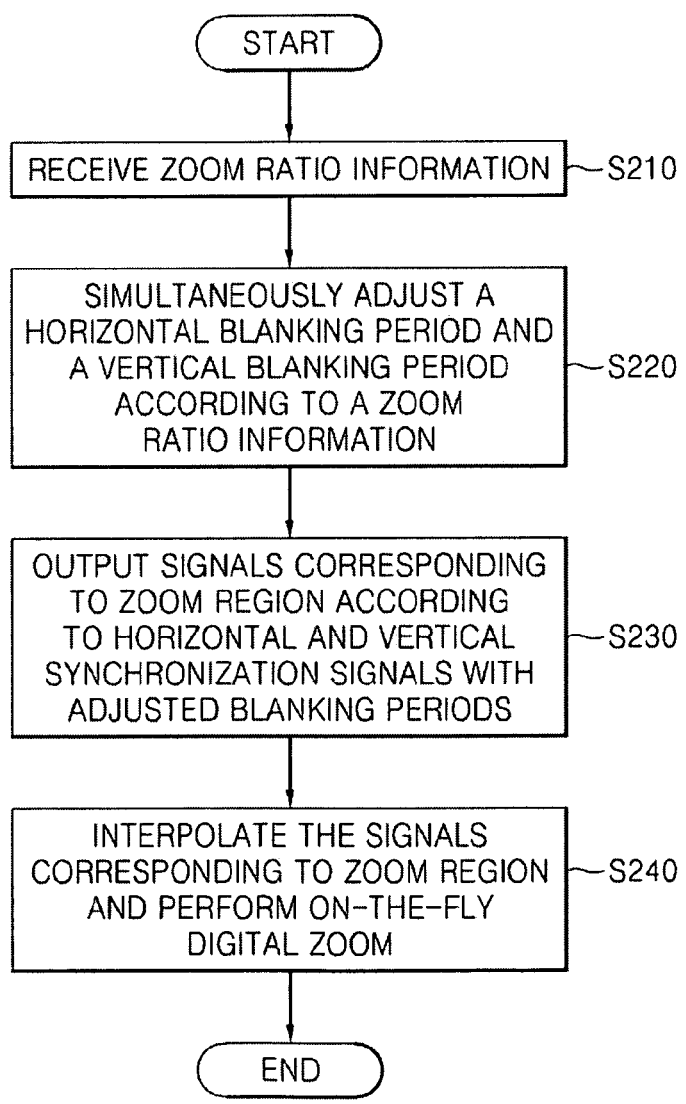
FIG. 26 is a flowchart of the operations of the image sensor chip illustrated in FIG. 16.

FIG. 26 is a flowchart of the operations of the image sensor chip 30 illustrated in FIG. 16. Referring to FIGS. 16 through 26, the timing generator 350 receives the digital zoom ratio information RSV indicating a digital zoom ratio in operation S210. The timing generator 350 simultaneously adjusts the horizontal blanking period of a horizontal synchronization signal and the vertical blanking period of a vertical synchronization signal according the digital zoom ratio information RSV and generates the first horizontal synchronization signal Hsync with an adjusted horizontal blanking period, the first vertical synchronization signal Vsync with an adjusted vertical blanking period, and the first data clock signal DCLK in operation S220.

The output circuit selects the data signal DATA corresponding to a zoom region from among data signals corresponding to pixel signals output from the active pixel array 110 according to the digital zoom ratio information RSV and outputs the data signal DATA corresponding to the zoom region according to first vertical synchronization signal Vsync, the first horizontal synchronization signal Hsync, and the first data clock signal DCLK in operation S230.

The zoom block 370 interpolates the data signal DATA output from the buffer 360 according to the digital zoom ratio information RSV and generates the interpolated data signal DATAa. The zoom block 370 also adjusts the horizontal blanking period of the first horizontal synchronization signal Hsync according to the digital zoom ratio information RSV and generates the second horizontal synchronization signal Hsynca with an adjusted horizontal blanking period. In other words, as described above with reference to FIGS. 22 and 23, the zoom block 370 controls the number of toggles and the pulse width of the first horizontal synchronization signal Hsync according to digital zoom ratio information RSV in order to process the interpolated data signal DATAa.

The zoom block 370 outputs the interpolated data signal DATAa according to the first vertical synchronization signal Vsync (=Vsynca), the second horizontal synchronization signal Hsynca, and the first data clock signal DCLK (=DCLKa). Consequently, the zoom block 370 interpolates the data signal DATA corresponding to the zoom region and performs on-the-fly digital zoom in operation S240.

As described above, the image sensor chip 30 illustrated in FIG. 16 does not require a frame buffer memory for digital zoom, so that the frame buffer memory and a controller for controlling the operation of the frame buffer memory are eliminated. As a result, the size of the image sensor chip 30 is reduced.

According to some embodiments of the present invention, an image sensor module includes an image sensor chip and an image signal processing chip that have different minimum feature sizes, so that influence of digital noise generated in the image signal processing chip on the image sensor chip is reduced or eliminated. In addition, the minimum feature size of a metal line of the image signal processing chip is less than that of a metal line of the image sensor chip, so that the degree of integration of the image signal processing chip is increased while the size of the image signal processing chip is decreased. Moreover, the image sensor chip does not require a frame buffer memory for digital zoom, and therefore, the frame buffer memory and a controller for controlling the operation of the frame buffer memory are eliminated. As a result, the size of the image sensor chip is reduced.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An image sensor module comprising:
    a printed circuit board (PCB);
    an image sensor chip on a first plane of the PCB and electrically connected to the PCB; and
    an image signal processing chip on the first plane of the PCB and electrically connected to the PCB,
    wherein an aspect ratio of the image signal processing chip is at least two times greater than an aspect ratio of the image sensor chip and a minimum feature size of a metal line implemented in the image sensor chip is at least 1.5 times greater than a minimum feature size of a metal line implemented in the image signal processing chip.

2. The image sensor module of claim 1, wherein the aspect ratio of the image sensor chip is 1.0 through 2.0 and the aspect ratio of the image signal processing chip is 3 through 10.

3. The image sensor module of claim 1, further comprising:
    a plurality of bonding wires configured to electrically connect the image sensor chip to the first plane of the PCB; and
    a plurality of solder bumps configured to flip-chip-bond the image signal processing chip to the first plane of the PCB.

4. The image sensor module of claim 1, wherein the image sensor chip comprises:
- a pixel array;
- a timing generator configured to generate a first horizontal synchronization signal and a first vertical synchronization signal whose respective horizontal and vertical blanking periods have been adjusted according to digital zoom ratio information; and
- an output circuit configured to output a data signal corresponding to a zoom region among data signals corresponding to signals output from the pixel array according to the first vertical synchronization signal and the first horizontal synchronization signal.

5. The image sensor module of claim 4, wherein the timing generator increases the horizontal blanking period and simultaneously decreases the vertical blanking period according to the digital zoom ratio information.

6. The image sensor module of claim 4, wherein the image sensor chip further comprises a zoom block configured to receive the data signal corresponding to the zoom region from the output circuit, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

7. The image sensor module of claim 4, wherein the image signal processing chip comprises a zoom block configured to receive the data signal corresponding to the zoom region from the output circuit of the image sensor chip, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

8. A package comprising:
the image sensor module of claim 1;
wherein an aspect ratio of the package is 0.8 through 1.2.

9. The package of claim 8, wherein the image sensor chip comprises:
- a pixel array;
- a timing generator configured to generate a first horizontal synchronization signal and a first vertical synchronization signal whose respective horizontal and vertical blanking periods have been adjusted according to digital zoom ratio information; and
- an output circuit configured to output a data signal corresponding to a zoom region among data signals corresponding to signals output from the pixel array according to the first vertical synchronization signal and the first horizontal synchronization signal.

10. The package of claim 9, wherein the image sensor chip further comprises a zoom block configured to receive the data signal corresponding to the zoom region from the output circuit, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

11. The package of claim 9, wherein the image signal processing chip comprises a zoom block configured to receive the data signal corresponding to the zoom region from the output circuit of the image sensor chip, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

12. A camera comprising:
a lens; and
the image sensor module of claim 1,
wherein the image sensor chip converts an optical signal passing through the lens into an electrical signal, and the image signal processing chip processes the electrical signal output from the image sensor chip.

13. The camera of claim 12, wherein the image sensor chip comprises:
- a pixel array;
- a timing generator configured to generate a first horizontal synchronization signal and a first vertical synchronization signal whose respective horizontal and vertical blanking periods have been adjusted according to digital zoom ratio information; and
- an output circuit configured to output a data signal corresponding to a zoom region among data signals corresponding to signals output from the pixel array according to the first vertical synchronization signal and the first horizontal synchronization signal.

14. The camera of claim 13, wherein the image sensor chip further comprises a zoom block configured to receive the data signal corresponding to the zoom region from the output circuit, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

15. The camera of claim 13, wherein the image signal processing chip comprises a zoom block configured to receive the data signal corresponding to the zoom region from the output circuit of the image sensor chip, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

16. The camera of claim 12, wherein the aspect ratio of the image sensor chip is 1.0 through 2.0 and the aspect ratio of the image signal processing chip is 3 through 10.

17. The camera of claim 12, wherein the image sensor module further comprises:
- a plurality of bonding wires configured to electrically connect the image sensor chip to a first plane of the PCB; and
- a plurality of solder bumps configured to flip-chip-bond the image signal processing chip to the first plane of the PCB.

18. The camera of claim 12, wherein the camera is implemented as a part of a member selected from the group consisting of a mobile phone, a smart phone, a web camera, a personal digital assistant, a person computer, a netbook, and a notebook computer.

19. An image sensor module comprising:
a printed circuit board (PCB);
an image sensor chip on a first plane of the PCB and electrically connected to the PCB; and
an image signal processing chip configured to be embedded in the PCB and to process signals output from the image sensor chip,
an aspect ratio of the image signal processing chip being at least two times greater than an aspect ratio of the image sensor chip.

20. The image sensor module of claim 19, further comprising:
a plurality of bonding wires configured to electrically connect the image sensor chip to the PCB; and
a plurality of bumps embedded in the PCB and connected to the image signal processing chip,
wherein the image signal processing chip processes the signals output from the image sensor chip through the plurality of bonding wires and the plurality of bumps.

21. The image sensor module of claim 19, further comprising:
a plurality of through-silicon vias (TSVs) configured to electrically connect the image sensor chip to the PCB; and
a plurality of bumps embedded in the PCB and connected to the image signal processing chip,
wherein the image signal processing chip processes the signals output from the image sensor chip through the plurality of TSVs and the plurality of bumps.

22. The image sensor module of claim 19, wherein and a minimum feature size of a metal line implemented in the image sensor chip is at least 1.5 times greater than a minimum feature size of a metal line implemented in the image signal processing chip.

23. The image sensor module of claim 19, wherein the image sensor chip comprises:
a pixel array;
a timing generator configured to generate a first horizontal synchronization signal and a first vertical synchronization signal whose respective horizontal and vertical blanking periods have been adjusted according to digital zoom ratio information; and
an output circuit configured to output a data signal corresponding to a zoom region among data signals corresponding to signals output from the pixel array according to the first vertical synchronization signal and the first horizontal synchronization signal.

24. The image sensor module of claim 23, wherein the timing generator increases the horizontal blanking period and simultaneously decreases the vertical blanking period according to the digital zoom ratio information.

25. The image sensor module of claim 23, wherein the image sensor chip further comprises a zoom block configured to receive the data signal corresponding to the zoom region from the output circuit, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

26. The image sensor module of claim 23, wherein the image signal processing chip comprises a zoom block configured to receive the data signal corresponding to the zoom region from the output circuit of the image sensor chip, interpolate the data signal, receive the first horizontal synchronization signal and the first vertical synchronization signal from the timing generator, adjust the horizontal blanking period of the first horizontal synchronization signal according to the digital zoom ratio information, and output an interpolated data signal according to the first vertical synchronization signal and a second horizontal synchronization signal with an adjusted horizontal blanking period.

27. The image sensor module of claim 1, wherein the image sensor chip is a CMOS image sensor chip, and the image signal processing chip is a CMOS image signal processing chip.

28. The image sensor module of claim 1, wherein the image sensor chip and the image signal processing chip are both located on the PCB such that the image sensor chip and the image signal processing chip are separated from one another and do not touch one another.

29. The image sensor module of claim 19, wherein the image sensor chip is a CMOS image sensor chip, and the image signal processing chip is a CMOS image signal processing chip.

30. The image sensor module of claim 19, wherein the image sensor chip and the image signal processing chip are both located on the PCB such that the image sensor chip and the image signal processing chip are separated from one another and do not touch one another.

31. The image sensor module of claim 1, wherein the image sensor chip and the image signal processing chip are both located on a first face of the PCB such that an aspect ratio of a second face is at least two times greater than an aspect ratio of a third face, the second face being a face of the image signal processing chip, the third face being a face of the image sensor chip, the second and third faces being parallel to the first face.

32. The image sensor module of claim 19, wherein the image sensor chip is located on a first face of the PCB such that an aspect ratio of a second face is at least two times greater than an aspect ratio of a third face, the second face being a face of the image signal processing chip, the third face being a face of the image sensor chip, the second and third faces being parallel to the first face.

* * * * *